(12) United States Patent
Wang et al.

(10) Patent No.: US 11,842,902 B2
(45) Date of Patent: Dec. 12, 2023

(54) SEMICONDUCTOR PACKAGE WITH ALIGNMENT MARK AND MANUFACTURING METHOD THEREOF

(71) Applicant: Taiwan Semiconductor Manufacturing Company, Ltd., Hsinchu (TW)

(72) Inventors: Po-Han Wang, Hsinchu (TW); Hung-Jui Kuo, Hsinchu (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 272 days.

(21) Appl. No.: 17/246,696

(22) Filed: May 2, 2021

(65) Prior Publication Data

US 2021/0257227 A1    Aug. 19, 2021

Related U.S. Application Data

(62) Division of application No. 16/527,015, filed on Jul. 30, 2019, now Pat. No. 10,998,202.

(60) Provisional application No. 62/737,879, filed on Sep. 27, 2018.

(51) Int. Cl.
| | |
|---|---|
| *H01L 21/56* | (2006.01) |
| *H01L 23/367* | (2006.01) |
| *H01L 23/538* | (2006.01) |
| *H01L 23/544* | (2006.01) |
| *H01L 23/00* | (2006.01) |
| *H01L 21/683* | (2006.01) |
| *H01L 21/48* | (2006.01) |
| *H01L 21/78* | (2006.01) |
| *H01L 23/31* | (2006.01) |

(52) U.S. Cl.
CPC ........ *H01L 21/566* (2013.01); *H01L 21/4853* (2013.01); *H01L 21/4857* (2013.01); *H01L 21/4871* (2013.01); *H01L 21/568* (2013.01); *H01L 21/6835* (2013.01); *H01L 21/78* (2013.01); *H01L 23/3128* (2013.01); *H01L 23/3675* (2013.01); *H01L 23/5383* (2013.01); *H01L 23/5386* (2013.01); *H01L 23/5389* (2013.01); *H01L 23/544* (2013.01); *H01L 24/19* (2013.01); *H01L 24/20* (2013.01); *H01L 2221/68372* (2013.01); *H01L 2221/68386* (2013.01); *H01L 2223/54426* (2013.01); *H01L 2224/214* (2013.01)

(58) Field of Classification Search
CPC .................................................... H01L 21/566
USPC .......................................................... 257/668
See application file for complete search history.

(56) References Cited

U.S. PATENT DOCUMENTS

| | | | |
|---|---|---|---|
| 5,291,064 A * | 3/1994 | Kurokawa | ............ H01L 23/473 |
| | | | 257/E23.098 |
| 9,000,584 B2 | 4/2015 | Lin et al. | |
| 9,048,222 B2 | 6/2015 | Hung et al. | |
| | (Continued) | | |

FOREIGN PATENT DOCUMENTS

JP    2008091681 A *  4/2008  ....... H01L 23/49562

*Primary Examiner* — Ajay Arora
(74) *Attorney, Agent, or Firm* — JCIPRNET

(57) ABSTRACT

A semiconductor package includes a die and an encapsulant. The die has an active surface and an opposite backside surface. The encapsulant wraps around the die and has a recess reaching the backside surface. A span of the recess differs from a span of the backside surface and a span of the encapsulant.

20 Claims, 24 Drawing Sheets

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2008/0006933 A1* | 1/2008 | Huang ............... H01L 23/4334 257/E23.092 |
| 2008/0211088 A1* | 9/2008 | Sato ................... H01L 23/3675 257/E23.102 |
| 2011/0062578 A1* | 3/2011 | Katagiri ............. H01L 21/6835 438/122 |
| 2011/0254156 A1* | 10/2011 | Lin .................... H01L 21/6835 257/737 |
| 2015/0123257 A1* | 5/2015 | Lin ......................... H01L 23/28 257/787 |
| 2017/0133354 A1* | 5/2017 | Chen ................... H01L 25/0657 |
| 2018/0065186 A1* | 3/2018 | Cullinan ........... H01L 21/67115 |

\* cited by examiner

SEMICONDUCTOR PACKAGE WITH ALIGNMENT MARK AND MANUFACTURING METHOD THEREOF

CROSS-REFERENCE TO RELATED APPLICATION

This application is a divisional application of U.S. non-provisional application Ser. No. 16/527,015, filed on Jul. 30, 2019, now allowed, and claims the priority benefit of U.S. provisional application Ser. No. 62/737,879, filed on Sep. 27, 2018. The entirety of the above-mentioned patent applications are hereby incorporated by reference herein and made a part of this specification.

BACKGROUND

Semiconductor devices and integrated circuits used in a variety of electronic applications, such as cell phones and other mobile electronic equipment, are typically manufactured from a single semiconductor wafer. The dies of the wafer may be processed and packaged with other semiconductor devices or dies at the wafer level, and various technologies have been developed for wafer level packaging. As electronic products are continuously miniaturized, heat dissipation of the packaged semiconductor dies has become an important issue for packaging technology. In addition, for multi-die packages, the arrangement of the dies and the corresponding connecting elements affects data transmission speed among semiconductor dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
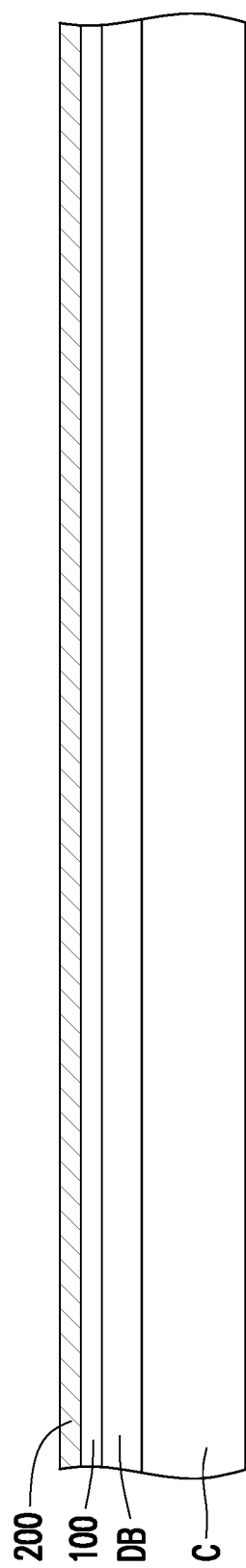
FIG. 1A through FIG. 1O show schematic cross-sectional views of structures produced at various stages of a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure describe the exemplary manufacturing process of package structures and the package structures fabricated there-from. Certain embodiments of the present disclosure are related to package structures formed with a heat dissipating structure. The wafers or dies may include one or more types of integrated circuits or electrical components on a bulk semiconductor substrate or a silicon/germanium-on-insulator substrate. The embodiments are intended to provide further explanations but are not to be used to limit the scope of the present disclosure.

FIG. 1A through FIG. 1O show schematic cross-sectional views illustrating structures produced at various stages of a manufacturing method of a semiconductor package 10 (shown in FIG. 1O) according to some embodiments of the disclosure. Referring to FIG. 1A, a carrier C having a de-bonding layer DB formed thereon is provided. In some embodiments, the carrier C is a glass substrate, a metal plate, a plastic supporting board or the like, but other suitable substrate materials may be used as long as the materials are able to withstand the subsequent steps of the process. In some embodiments, the de-bonding layer DB includes a light-to-heat conversion (LTHC) release layer, which facilitates peeling the carrier C away from the semiconductor package when required by the manufacturing process.

Referring to FIG. 1A, in some embodiments a dielectric layer 100 is formed over the de-bonding layer DB. In some embodiments, the material of the dielectric layer 100 includes polyimide, epoxy resin, acrylic resin, phenol resin, benzocyclobutene ("BCB"), polybenzooxazole ("PBO"), or any other suitable polymer-based dielectric material. In some embodiments, the dielectric layer 100 may be formed by spin-coating or other suitable deposition techniques. The disclosure is not limited by the process chosen to form the dielectric layer 100, nor by the inclusion of the dielectric layer 100 in the first place. In some alternative embodiments, the dielectric layer 100 may be omitted.

In some embodiments, a blanket die attach film 200 is formed over the dielectric layer 100. In some embodiments, the blanket die attach film 200 is formed by spin-coating over the carrier a die attach material (not shown). In some embodiments, forming the blanket die attach film 200 by spin-coating provides a film of substantially uniform thickness and with little, if any, irregularities. In some embodiments, a soft-baking step is performed after spin-coating the blanket die attach film 200. In some embodiments, a temperature of the soft-baking step is in the range between 50° C. to 150° C., but the disclosure is not limited thereto. In some embodiments, the die attach material includes a photoactivatable material and a thermally curable adhesive material. In some embodiments, the die attach material includes a thermally curable adhesive material functionalized with photoactivatable groups.

Figure 1B:
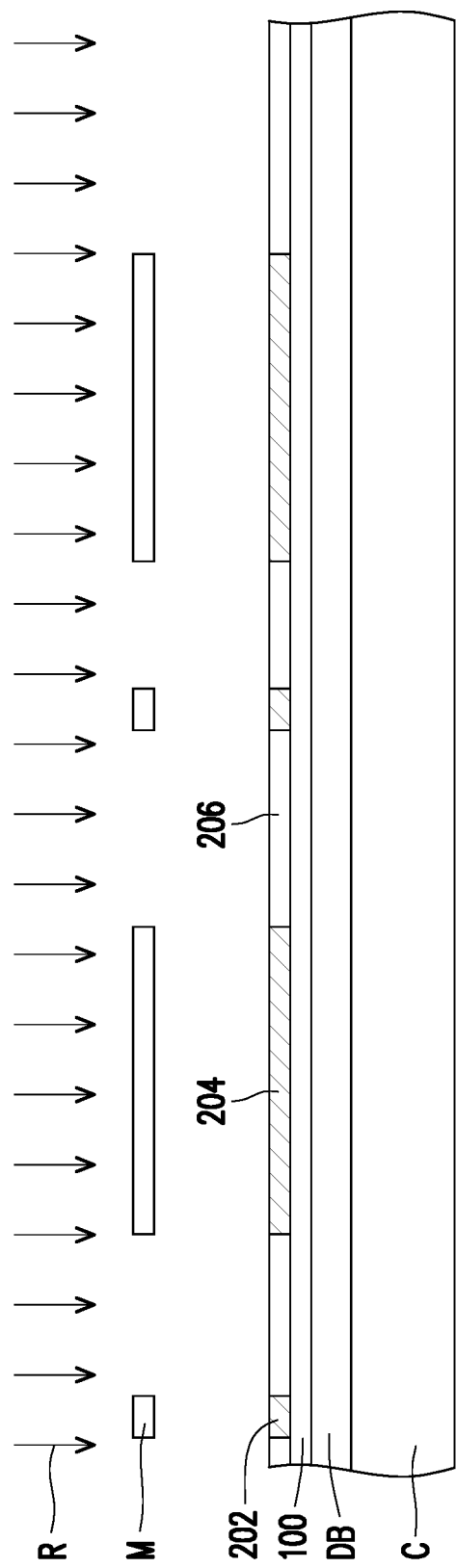
FIG. 1P shows a schematic cross-sectional view of a semiconductor package connected to a circuit substrate according to some embodiments of the present disclosure.
Figure 1C:
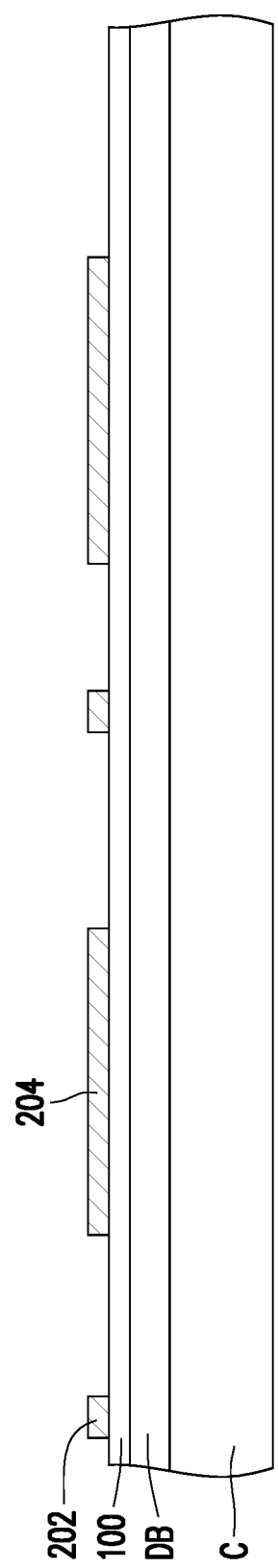

Referring to FIG. 1A through FIG. 1C, the blanket die attach film 200 may be treated with radiation R of a wavelength selected to activate the photoactivatable material or the photoactivatable groups included in the die attach material. As shown in FIG. 1B, portions 202 and 204 of the blanket die attach film 200 may be shielded from the radiation R, for example by using an auxiliary mask M. In some embodiments, the auxiliary mask M may include filters blocking the radiation R, but the disclosure is not limited thereto.

In some embodiments, the mask M may let the radiation R reach the blanket die attach film 200 in correspondence of regions 206 in which the die attach material gets photoactivated. The photoactivated die attach material in the regions 206 may have an increased solubility in a given solvent system compared to the non-irradiated portions 202 and 204, so that selective removal of the material from the regions 206 may be possible. Following a developing step, the material in the irradiated regions 206 may be selectively removed, leaving only one or more patterned portions 202, 204 of the original die attach film 200 over the carrier C. In other words, the photoactivatable material or the photoactivatable groups may render the blanket die attach film 200 patternable in a similar manner as a positive photoresist. However, the disclosure is not limited thereto. In some alternative embodiments, the blanket die attach film 200 may behave like a negative photoresist, and the patterning step may be performed accordingly. That is, the solubility of the die attach material may decrease upon exposure to the radiation R with respect to the non-irradiated material. In these embodiments, an auxiliary mask (not shown) may be used that shields the regions 206 to be removed of the blanket die attach film 200 while exposing the desired patterned portions 202 and 204.

Figure 1D:
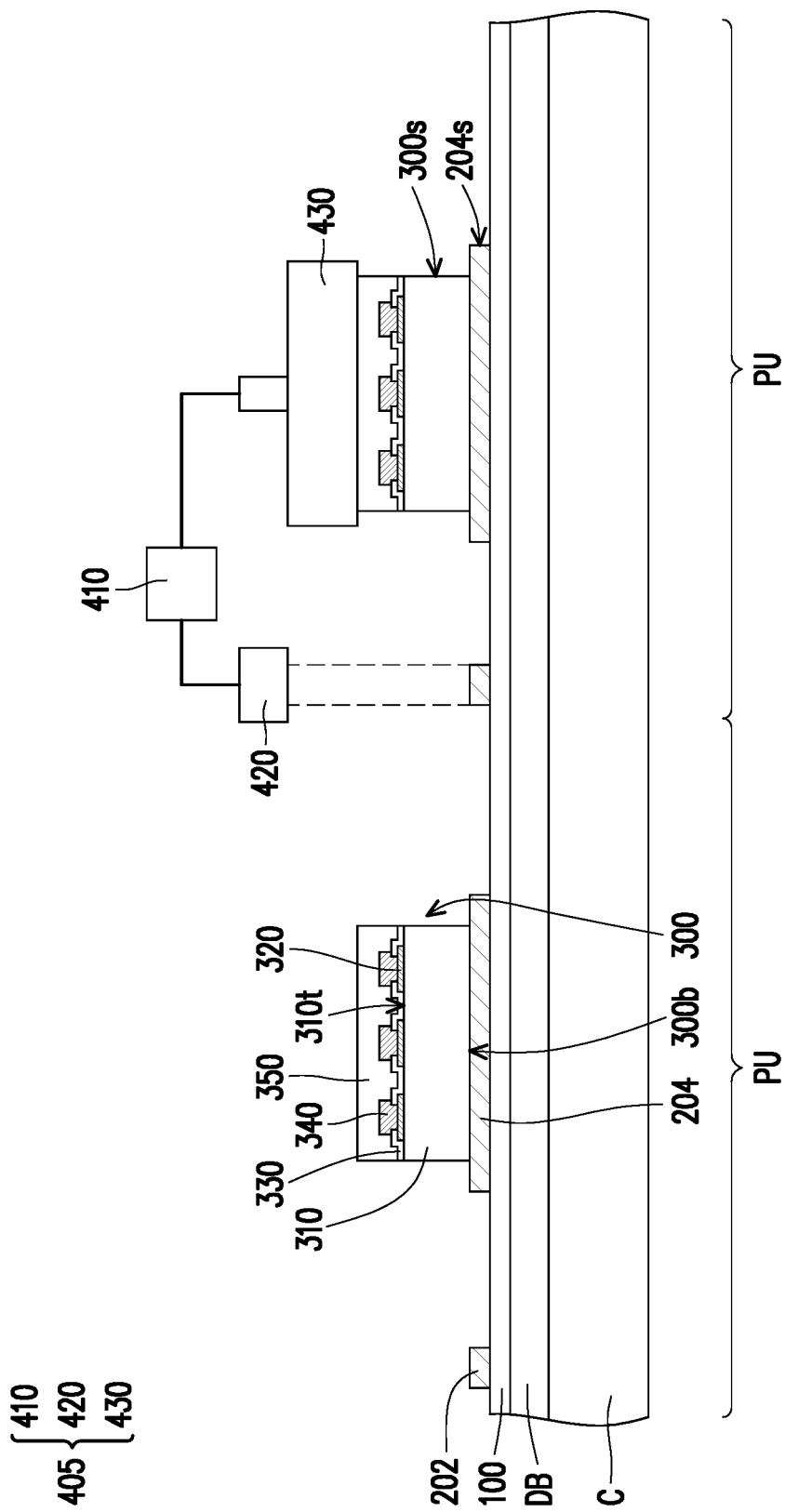

In some embodiments, referring to FIG. 1D, a semiconductor die 300 is provided over one of the patterned portions 204 of the die attach film 200. Even though only one semiconductor die 300 is presented in FIG. 1D for illustrative purposes, it is understood that a semiconductor package according to some embodiments of the disclosure may contain one or more than one semiconductor die 300. Furthermore, multiple semiconductor dies 300 may be provided on the carrier C to produce multiple package units PU with wafer-level packaging technology. In some embodiments, each package unit PU may include more than one semiconductor die 300.

In some embodiments, the semiconductor die 300 includes a semiconductor substrate 310, one or more contact pads 320, and a passivation layer 330. The contact pads 320 may be formed on a top surface 310t of the semiconductor substrate 310. The passivation layer 330 may cover the top surface 310t and have a plurality of openings that exposes at least a portion of each contact pad 320. In some embodiments, the semiconductor die 300 may further include a plurality of conductive posts 340 filling the openings of the passivation layer 330 and electrically connected to the contact pads 320, and a protective layer 350 surrounding the conductive posts 340. In some embodiments the protective layer 350 may completely cover the conductive posts 340. In some embodiments, the semiconductor die 300 is placed on the patterned portion 204 with the top surface 310t of the semiconductor substrate 310 facing away from the carrier C. A backside surface 300b of the semiconductor die 300 opposite to the top surface 310t may be in contact with the patterned portion 204.

In some embodiments, the semiconductor substrate 310 shown may be made of semiconductor materials, such as semiconductor materials of the groups III-V of the periodic table. In some embodiments, the semiconductor substrate 310 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 310 includes active components (e.g., transistors or the like) and optionally passive components (e.g., resistors, capacitors, inductors, or the like) formed therein. In certain embodiments, the contact pads 320 include aluminum pads, copper pads, or other suitable metal pads. In some embodiments, the passivation layer 330 may be a single layer or a multi-layered structure, including a silicon oxide layer, a silicon nitride layer, a silicon oxy-nitride layer, a dielectric layer formed by other suitable dielectric materials or combinations thereof. In some embodiments, the material of the conductive posts 340 includes copper, copper alloys, or other conductive materials, and may be formed by deposition, plating, or other suitable techniques. In some embodiments, similar structural features as the ones just discussed for the semiconductor die 300 may be found in the other semiconductor dies of the package unit PU being formed.

The semiconductor die 300 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 300 may be a memory die. The disclosure is not limited by the type of die used for the semiconductor die 300.

In some embodiments, as shown in FIG. 1D, the semiconductor die 300 is placed onto the patterned portion 204 through a pick-and-place method. In some embodiments, the patterned portion 204 acts as patterned die adhesive to secure the semiconductor die 300 over the carrier C. In some embodiments, a span of the patterned die adhesive 204 over the carrier C is larger than a span of the semiconductor die 300. That is, the patterned die adhesive 204 may extend beyond the sides of the die 300, so that a side edge 204s of the patterned die adhesive 204 is misaligned with a side surface 300s of the semiconductor die 300. In some embodiments, the side surface 300s of the semiconductor die 300 may be the surface substantially normal to the backside surface 300b. In some cases, the patterning step may result in a patterned die adhesive 204 with a span about equal to the span of the semiconductor die 300. In some alternative embodiments, the span of the patterned die adhesive 204 may be smaller than the span of the semiconductor die 300, and the semiconductor die 300 may extend beyond the sides of the patterned die adhesive 204.

In some embodiments, the patterned portions 202 are used as alignment marks during the die placement step. That is, a die placing equipment 405 may include, or be connected to, a controller 410 configured to sense a position of an alignment mark 202 via a sensor 420. The controller 410, based on the sensed position of the alignment mark 202, aligns an arm 430 to place the semiconductor die 300 on the patterned die adhesive 204. As such, according to the present disclosure, it is possible to form alignment marks 202 during the same patterning step forming the patterned die adhesive 204, thus increasing the accuracy of the die placement step, simplifying the process and reducing the manufacturing costs. However, in the present disclosure the alignment marks 202 may be omitted. In some alternative embodiments, different portions or patterns of the patterned die adhesive 204 may be used as alignment marks during the die placement step. In some alternative embodiments, other approaches to align the semiconductor die 300 to the patterned die adhesive 204 may be used, and the disclosure is not limited thereto.

After the semiconductor dies 300 are placed on the patterned die adhesives 204, a curing step may be performed to attach the dies 300 over the carrier C. In some embodiments, the curing step may be a thermal curing process. A temperature and a duration of the thermal curing process may vary according to the die attach material used. In some embodiments, a temperature of the curing step may be in the range between 150 and 250° C., but the disclosure is not limited thereto. In some embodiments, the temperature of the curing step may be higher than the temperature of the soft-baking step. Following the curing process, the alignment marks 202 (if present) and the patterned die adhesives 204 may become cured alignment marks 212 (shown in FIG. 1E) and cured die adhesives 214 (shown in FIG. 1E). In some embodiment, a temperature and a duration of the curing step may be adjusted according to the die attach material used.

Figure 1E:
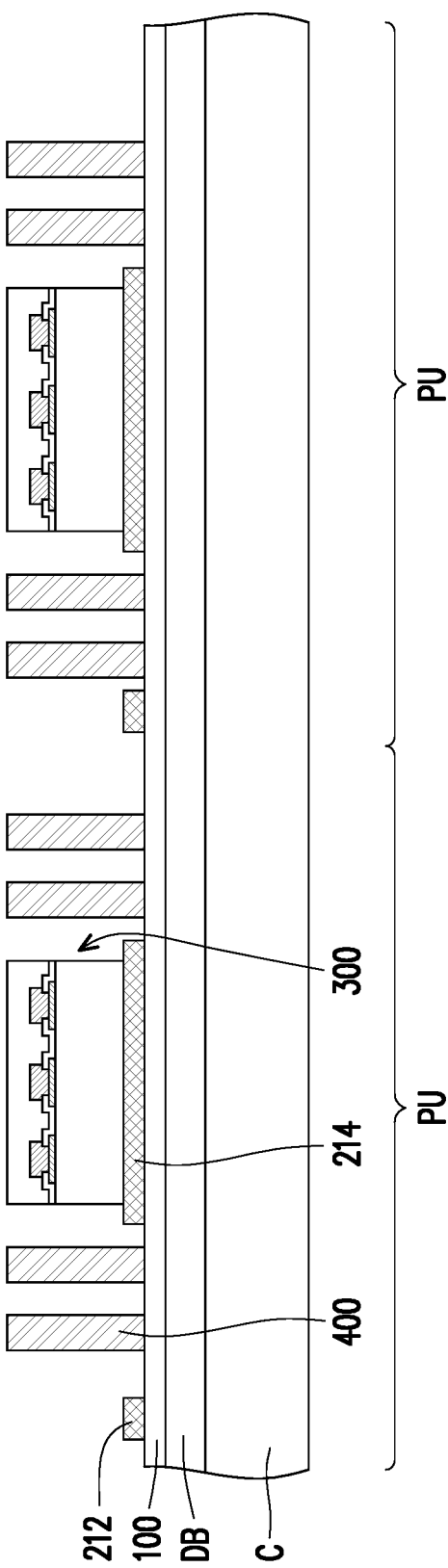

Referring to FIG. 1E, in some embodiments, through interlayer vias ("TIVs") 400 are formed over the carrier C. In some embodiments, the TIVs 400 are through integrated fan-out ("InFO") vias. In some embodiments, the TIVs 400 are formed by forming a mask pattern (not shown) having one or more openings, and forming a metallic material (not shown) filling up the openings to form the TIVs by electroplating or deposition. In some embodiments, a seed layer (not shown) may be formed at the bottom of the openings to facilitate formation of the metallic material. In some embodiments, the seed layer may be formed before forming the mask pattern, but the disclosure is not limited thereto. In some embodiments, the TIVs 400 are formed beside the semiconductor die 300 and the cured die adhesive 214. It should be noted that whilst four TIVs 400 are shown within each package unit PU of FIG. 1E, the number of TIVs 400 is not to be construed as a limitation of the disclosure. In some alternative embodiments, fewer or more TIVs 400 may be formed.

Figure 1F:
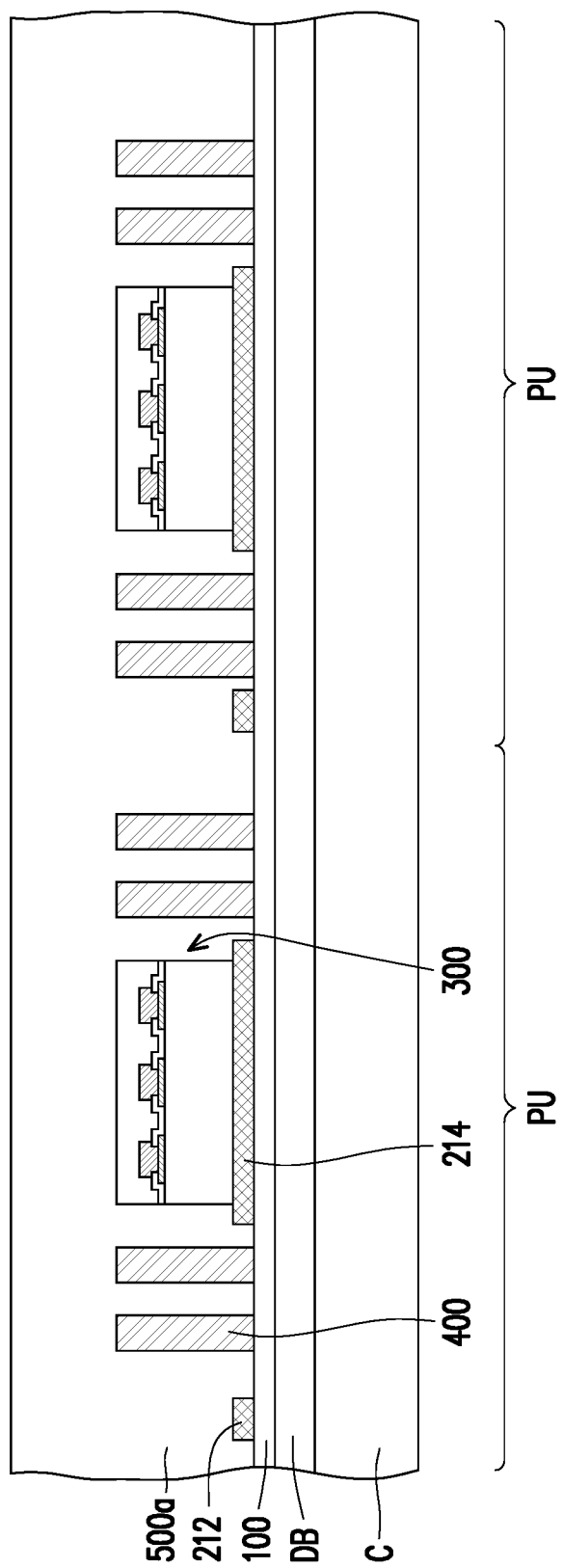

Referring to FIG. 1F, an encapsulating material 500a is formed over the carrier C to at least encapsulate the semiconductor die 300, the TIVs 400, the cured die adhesive 214, and the cured alignment marks 212 (if present). In some embodiments, the semiconductor die 300 and the TIVs 400 are fully covered and not revealed by the encapsulating material 500a. In some embodiments, the encapsulating material 500a may be a molding compound, a molding underfill, a resin (such as an epoxy resin), or the like. In some embodiments, the encapsulating material 500a is formed by an over-molding process. In some embodiments, the encapsulating material 500a is formed by a compression molding process.

Figure 1G:
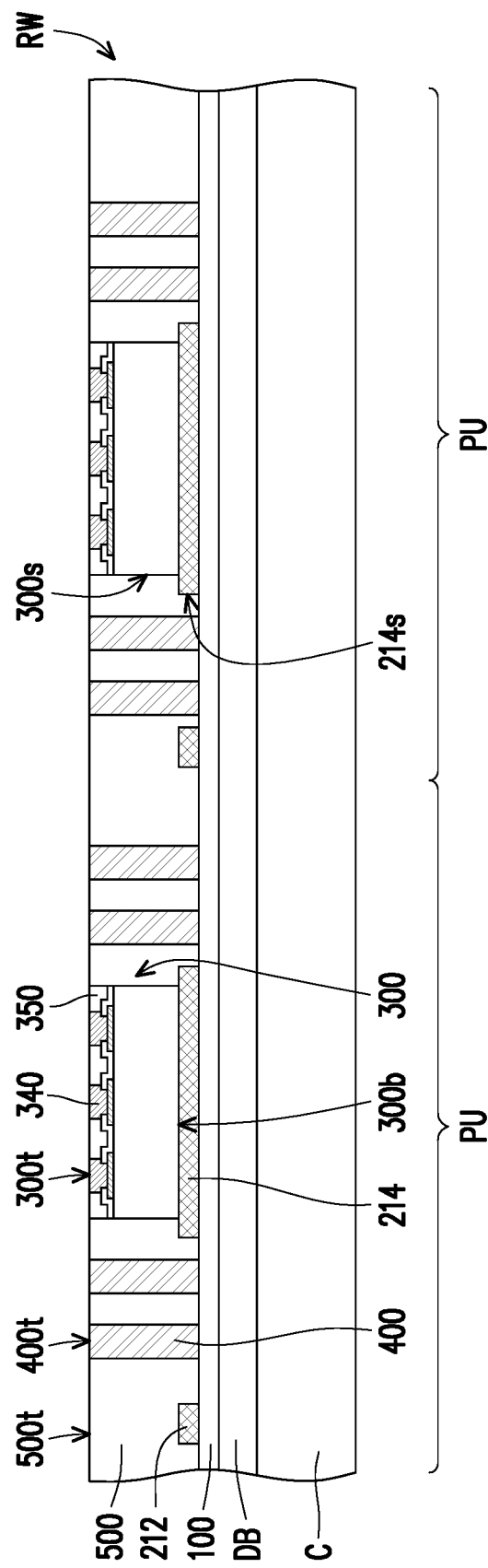

Referring to FIG. 1F and FIG. 1G, in some embodiments, the encapsulating material 500a is partially removed by a planarization process until the conductive posts 340 of the semiconductor die 300 are exposed. In some embodiments, a portion of the protective layer 350 may be removed during the planarization process to expose the conductive posts 340. In some embodiments, portions of the conductive posts 340 and of the TIVs 400 may be removed during the planarization step. Planarization of the encapsulating material 500a may produce an encapsulant 500 that surrounds the semiconductor die 300, the TIVs 400, the cured die adhesive 214 and the cured alignment mark 212. Following planarization, an active surface 300t of the semiconductor die 300 exposing the conductive posts 340 may be substantially coplanar with a top surface 400t of the TIVs 400 and with a top surface 500t of the encapsulant 500. In some embodiments, the planarization of the encapsulating material 500a includes performing a mechanical grinding process and/or a chemical mechanical polishing (CMP) process. As shown in FIG. 1G, when the span of the cured die adhesive film 214 is larger than the span of the semiconductor die 300, the cured die adhesive film 214 may extend into the encapsulant 500 towards the TIVs 400, so that the side edge 214s of the cured die adhesive film 214 is closer to the TIVs 400 than the side surface 300s of the semiconductor die 300. In some embodiments, the side surface 300s connects the active surface 300t to the backside surface 300b.

With the formation of the encapsulant 500, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1G, two package unit PU are shown for simplicity, but, of course, this is for illustrative purposes only, and the disclosure is not limited by the number of package units PU being produced in the reconstructed wafer RW.

Figure 1H:
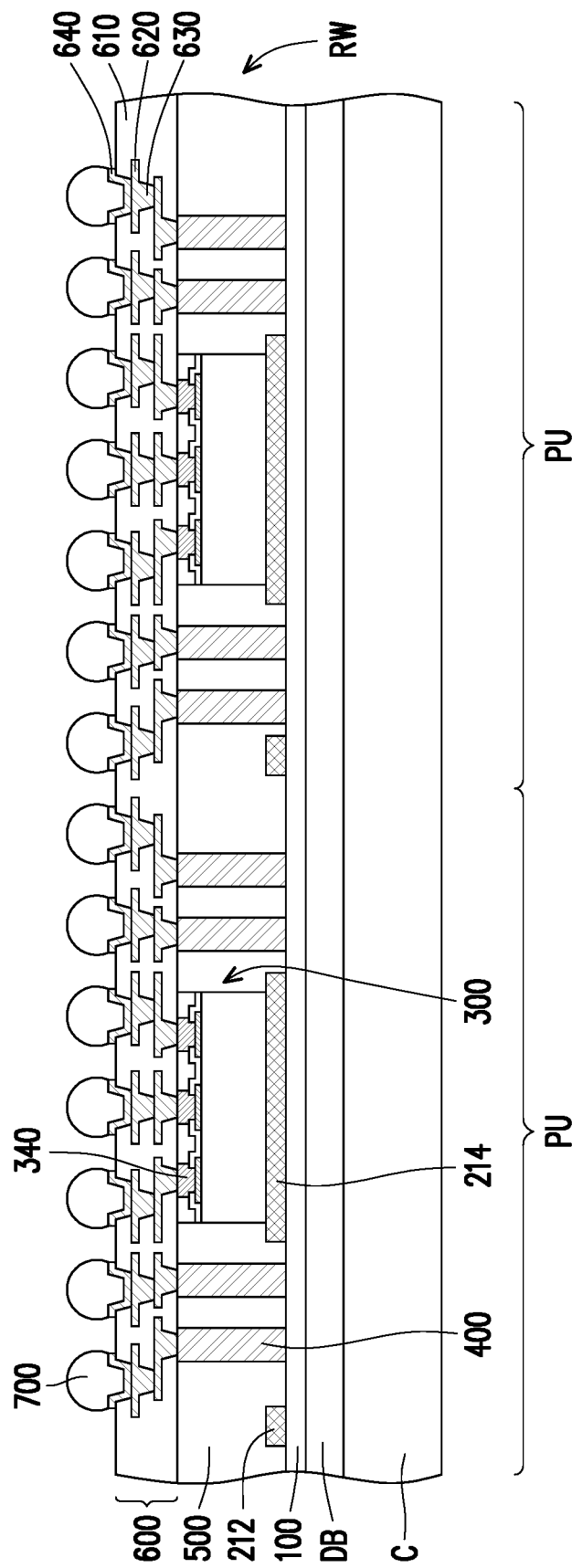

Referring to FIG. 1H, a redistribution structure 600 is formed over the semiconductor die 300, the TIVs 400 and the encapsulant 500. In some embodiments, the redistribution structure 600 includes at least one dielectric layer 610 and at least one redistribution conductive layer 620. Each redistribution conductive layer 620 may be constituted by a plurality of redistribution conductive patterns. For simplicity, the dielectric layer 610 is illustrated as one single layer of dielectric layer and the redistribution conductive layers 620 are illustrated as embedded in the dielectric layer 610. Nevertheless, from the perspective of the manufacturing process, the dielectric layer 610 is constituted by at least two dielectric layers and each redistribution conductive layer 620 is sandwiched between two adjacent dielectric layers 610. In some embodiments, a material of the redistribution conductive layers 620 includes aluminum, titanium, copper, nickel, tungsten, and/or alloys thereof. The redistribution conductive layers 620 may be formed by, for example, electroplating, deposition, and/or photolithography and etching. In some embodiments, a material of the dielectric layers 610 includes polyimide, epoxy resin, acrylic resin, phenol resin, benzocyclobutene (BCB), polybenzooxazole (PBO), or any other suitable polymer-based dielectric material. The dielectric layers 610, for example, may be formed by suitable fabrication techniques such as spin-on coating, chemical vapor deposition (CVD), plasma-enhanced chemical vapor deposition (PECVD), or the like. It should be noted that the number of redistribution conductive layers 620 illustrated in FIG. 1H is merely for illustrative purposes, and the disclosure is not limited thereto. In some alternative embodiments, more or fewer redistribution conductive layers 620 may be formed depending on the circuit design. When the redistribution structure 600 includes multiple redistribution conductive layers 620, the redistribution conductive layers 620 may be interconnected with one another by conductive vias 630 embedded in the dielectric layer 610.

In some embodiments, the dielectric layer 610 closer to the encapsulant 500 has a plurality of openings filled by some of the conductive vias 630. The bottommost conductive vias 630 contacts the conductive posts 340 of the semiconductor die 300 and the TIVs 400, thus establishing electrical connection between the semiconductor die 300, the TIVs 400, and the redistribution structure 600. In some embodiments, multiple semiconductor dies 300 within the same package unit PU may be electrically connected through the redistribution structure 600.

Referring to FIG. 1H, the dielectric layer 610 further from the encapsulant 500 presents another plurality of openings exposing the topmost redistribution conductive layer 620. In some embodiments, a plurality of connective terminals 700 contacts the topmost conductive layer 620 of the redistribution structure 600 through the openings, in such a way that the connective terminals 700 are electrically connected with the redistribution structure 600. In some embodiments, a plurality of under-bump metallurgies 640 may be provided between the connective terminals 700 and the topmost conductive layer 620 for better adhesion and connection reliability. The under-bump metallurgies 640 may be conformally formed in the topmost openings of the dielectric layer 610, and further extend on portions of the dielectric layer 610 at the sides the openings where the connective terminals 700 are located. In some embodiments, the connective terminals 700 include ball grid array (BGA) balls or solder balls. In some embodiments, the connective terminals 700 may be placed on the under-bump metallurgies 640 through a ball placement process.

Figure 1I:
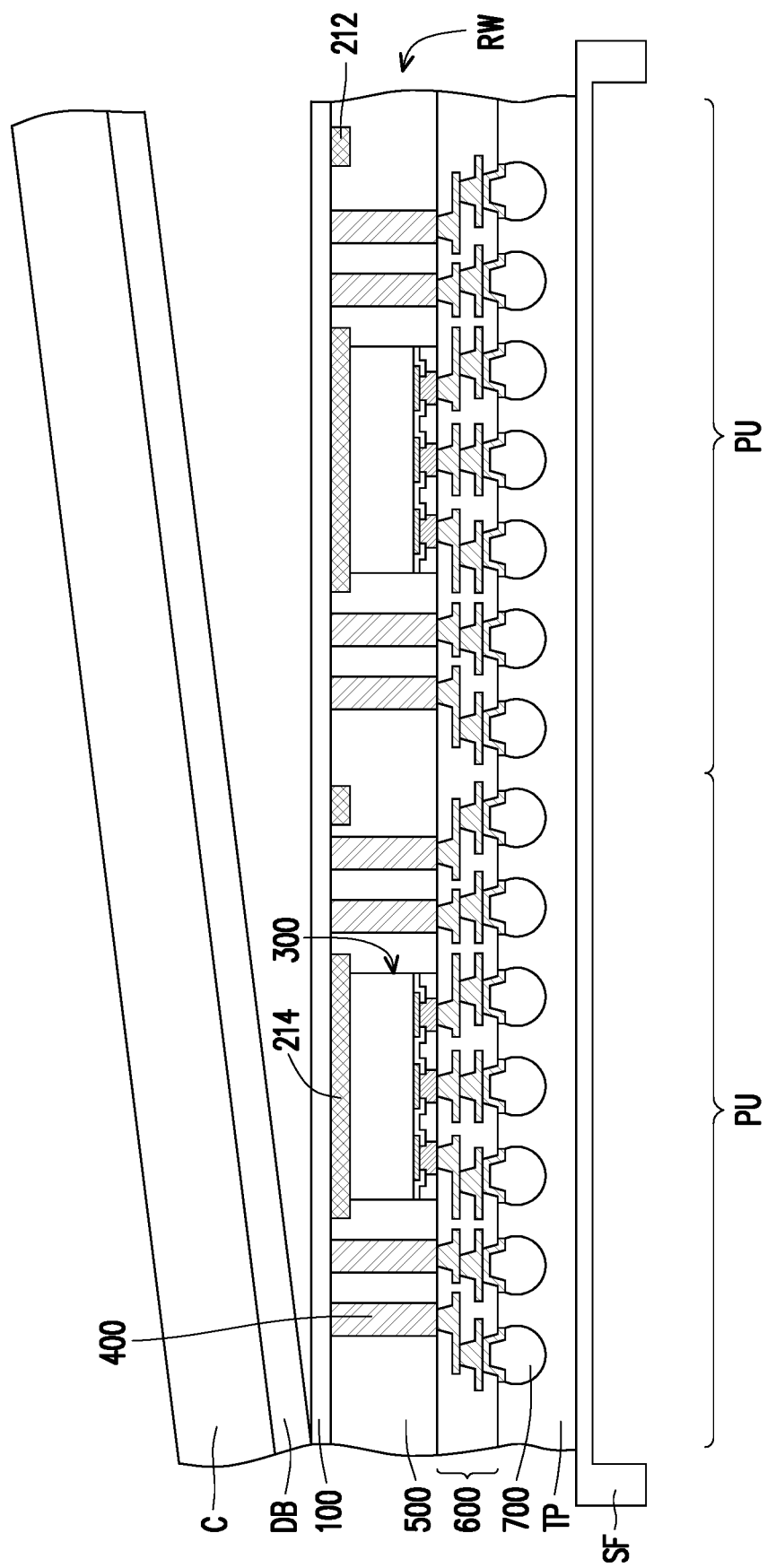

Referring to FIG. 1H and FIG. 1I, the surface of the reconstructed wafer RW where the connective terminals 700 have been formed may be embedded in a protective tape TP, and the reconstructed wafer RW may be overturned over a supporting frame SF to continue the manufacturing process. In some embodiments, the de-bonding layer DB (e.g., the LTHC release layer) is irradiated with radiation of appropriate wavelength, so that the carrier C and the de-bonding layer DB are easily peeled off from the reconstructed wafer RW. Nevertheless, the de-bonding process is not limited thereto, and other suitable de-bonding methods may be used in some alternative embodiments. Removal of the carrier C from the reconstructed wafer RW exposes the dielectric layer 100, which becomes then available for further processing.

Figure 1J:
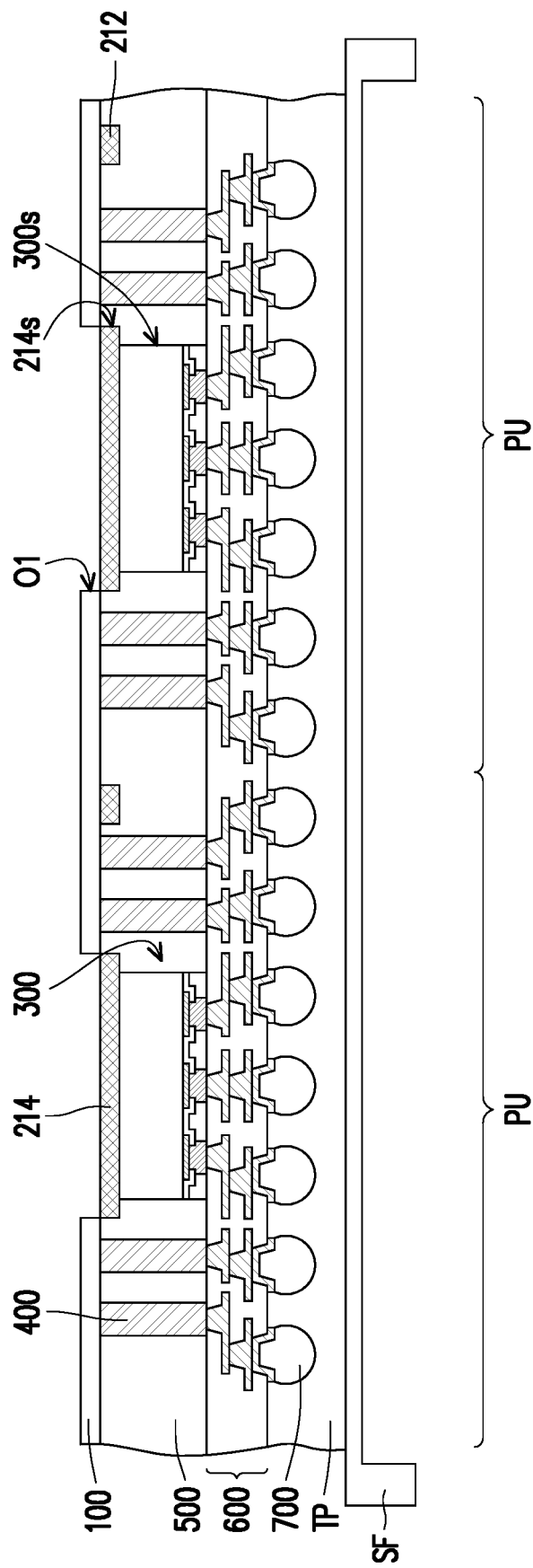
Figure 1K:
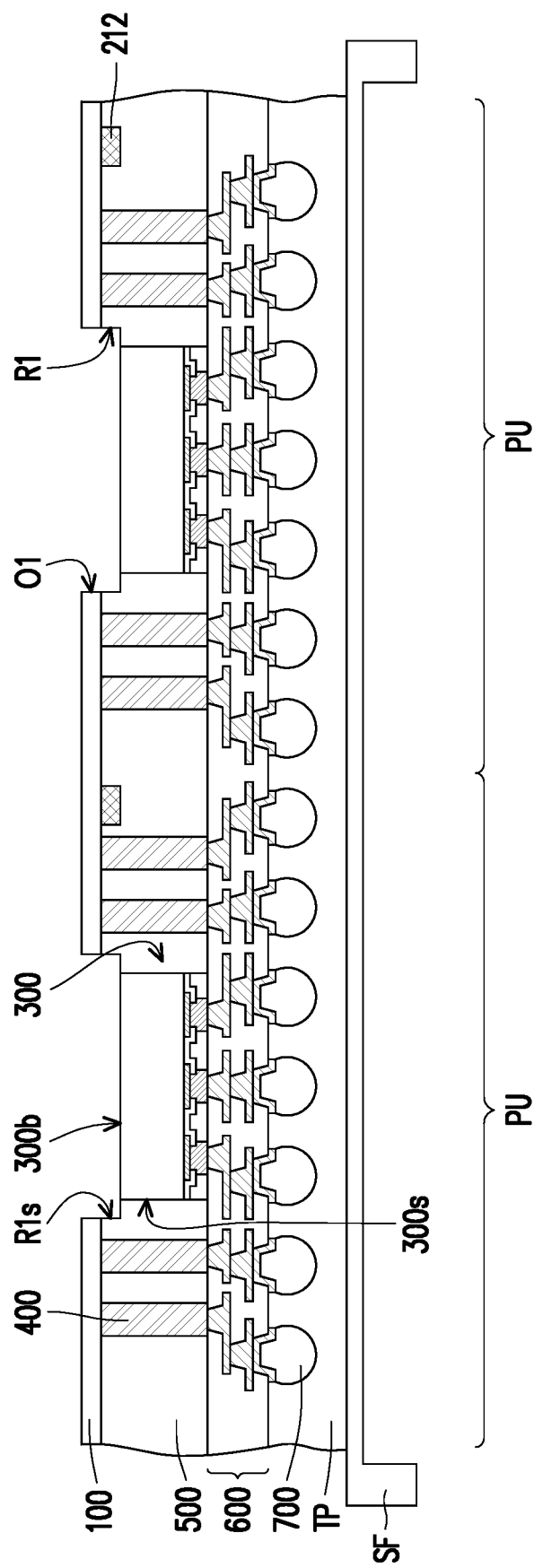

Referring to FIG. 1J and FIG. 1K, opening O1 may be formed in the dielectric layer 100 to expose the cured die adhesive 214. In some embodiments, the openings O1 may be formed by laser drilling or etching. The cured die adhesive 214 may then be removed, for example with a stripping or etching process. In some embodiments, different materials may respond differently to the strain produced during the removal of the cured die adhesive 214. In some cases, the strain produced when removing the cured die adhesive 214 may result in delamination or cracking of the encapsulant 500 at the interface with the semiconductor die 300. In some embodiments of the present disclosure, by having the side edge 214s of the cured die adhesive 214 not coplanar with the side surface 300s of the semiconductor die 300, the strain generated during removal of the cured die adhesive 214 may be efficiently dispersed, reducing the occurrence of defects or failure rate of the produced semiconductor packages and increasing the overall yield of the manufacturing process.

As shown in FIG. 1K, removal of the cured die adhesive 214 reveals portions of the encapsulant 500 and the backside surface 300b of the semiconductor die 300. That is, through the removal of the cured die adhesive 214, a recess R1 is defined. In some embodiments, the recess R1 defined by the exposed portions of the encapsulant 500 reveals the backside surface 300b of the semiconductor die 300. In some embodiments, as seen in FIG. 1K, side walls R1s of the recess R1 are defined by the encapsulant 500, whilst a bottom of the recess R1 is defined by the encapsulant 500 and by the backside surface 300b of the semiconductor die 300. In some embodiments, the sidewalls R1s are not aligned with the side surface(s) 300s of the semiconductor die 300. In some alternative embodiments, the cured die adhesive 214 may not be removed, and kept within the finished semiconductor package (not shown).

Figure 1L:
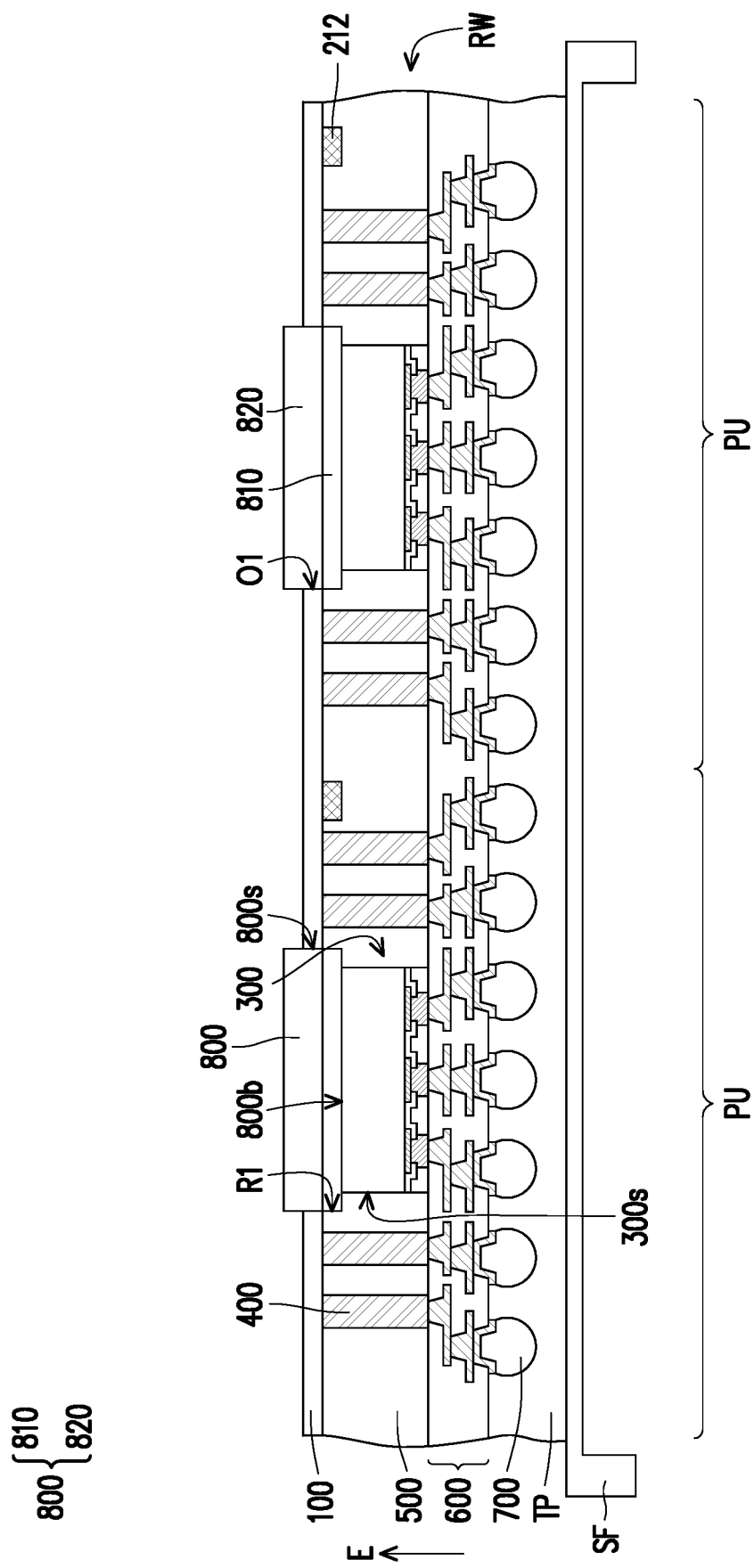

Referring to FIG. 1L, in some embodiments, a heat spreader 800 is formed in the recess R1 and is attached to the semiconductor die 300. The heat spreader 800 may help to disperse the heat generated by the semiconductor die 300 during operation. In some embodiments, the heat spreader 800 includes a thermal interface layer 810 and a thermal spreader 820. In some embodiments, the thermal interface layer 810 at least extends at the bottom of the recess, covering the backside surface 300b of the semiconductor die 300. In some embodiments, the thermal interface layer 810 may fully cover the bottom of the recess R1 or even fill up the recess R1, but the disclosure is not limited thereto. In some embodiments, a span of the thermal interface layer 810 matches a span of the recess R1. In some embodiments, the span of the heat spreader 800 matches the span of the recess R1, so that side surfaces 800s of the heat spreader 800 are (vertically) misaligned with the side surface(s) 300s of the semiconductor die 300 along a thickness direction E of the reconstructed wafer RW. In some embodiments, a bottom surface 800b of the heat spreader is in physical contact with the semiconductor die 300. In some embodiments, at least a portion of the bottom surface 800b physically contacts the encapsulant 500. In some embodiments, the thermal interface layer 810 may include an adhesive material layer (not shown) disposed beside or mixed within the thermal interface layer 810 to securely attach the thermal spreader 820 within the package unit PU. In some embodiments, as shown in FIG. 1L, the thermal interface layer 810 fills at least partially the recess R1, but the disclosure is not limited thereto. In some embodiments, a thickness of the thermal interface layer 810 is such that the thermal spreader 820 disposed thereon does not contact the encapsulant 500. In some embodiments, the thermal spreader 820 protrudes from the dielectric layer 100. In some alternative embodiments, the thickness of the thermal interface layer 810 is such that the recess R1 is not entirely filled, and the thermal spreader 820 is at least partially embedded within the encapsulant 500.

In some embodiments, a material of the thermal interface layer 810 may include a polysiloxane resin having particles of alumina, zinc oxide, silver, or a combination thereof suspended therein. In some embodiments, other materials may be used for the thermal interface layer 810, provided they are thermally conductive and display acceptable to good adhesive properties with the materials of the contacting elements. A thickness of the thermal interface layer 810 is not particularly limited. In some embodiments, the thermal interface layer 810 may present a thickness between 10 to 200 μm, but the thickness may be adjusted according to design and performance requirements. The thermal interface layer 810 may be formed by stencil printing, spin coating, dispensing or other suitable techniques. A curing step may sometimes be required after disposing the material of the thermal interface layer 810.

In some embodiments, the thermal spreader 820 may be manufactured separately and disposed over the thermal interface layer 810. A material of the thermal spreader 820 may include metals such as copper, nickel, their alloys, or combination thereof. A thickness of the thermal spreader 820 is not particularly limited, and may be comprised between 300 μm to 3 mm, depending on performance and design requirements. In some embodiments, the thermal spreader 820 layer may include a block of thermally conductive material. In some alternative embodiments, the thermal spreader 820 may be a heat pipe that carries away the heat produced by the operation of the semiconductor die 300.

Figure 1M:
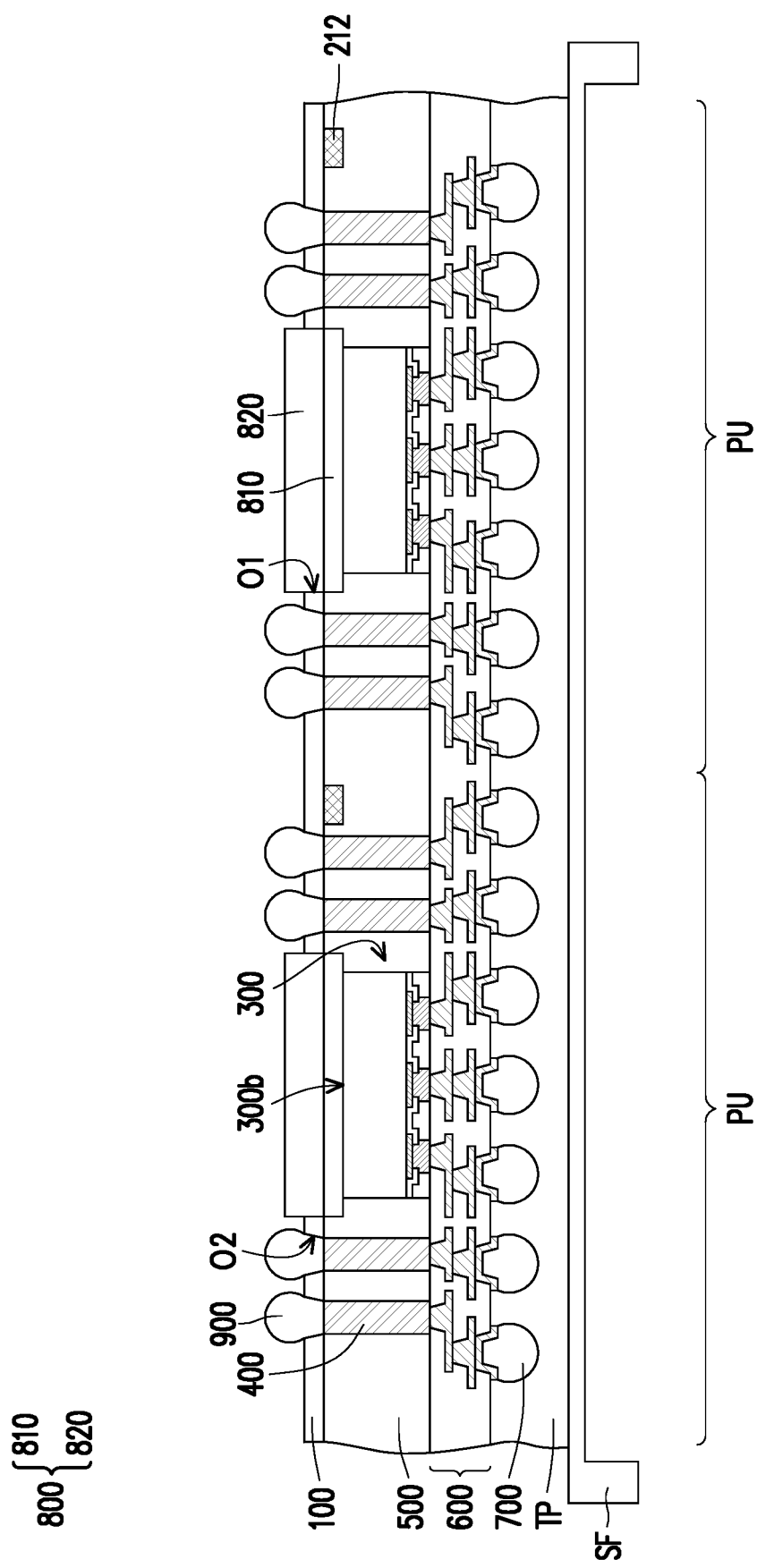

Referring to FIG. 1M, in some embodiments, second openings O2 are formed in the dielectric layer 100 to expose the TIVs 400, and second conductive terminals 900 are formed in the second opening O2. In some embodiments, under-bump metallurgies (not show) may be provided between the second conductive terminals 900 and the TIVs 400 for better adhesion and connection reliability. In some embodiments, the second connective terminals 900 include ball grid array (BGA) balls or solder balls. In some embodiments, the second connective terminals 900 may be provided through a ball placement process.

Figure 1N:
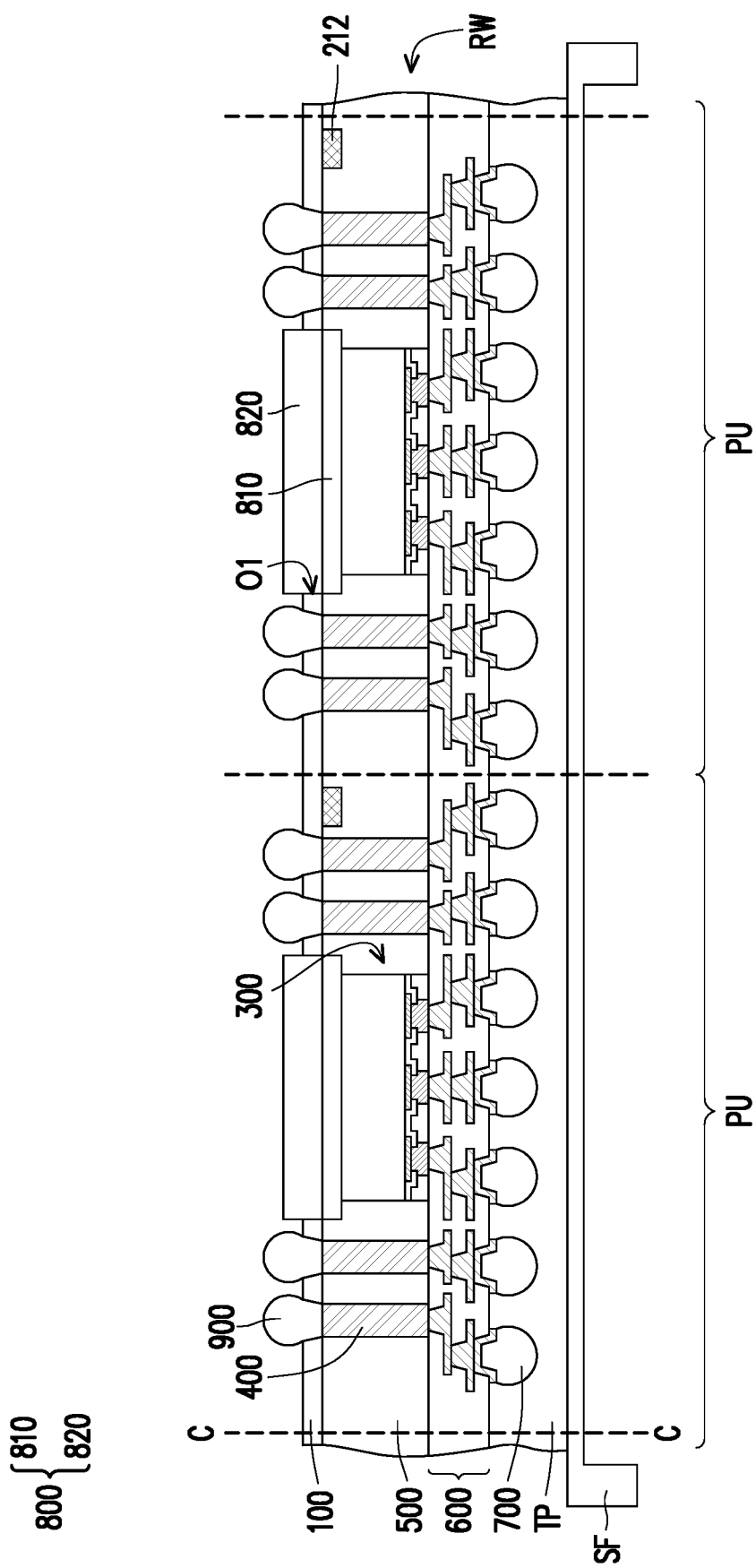
Figure 10:
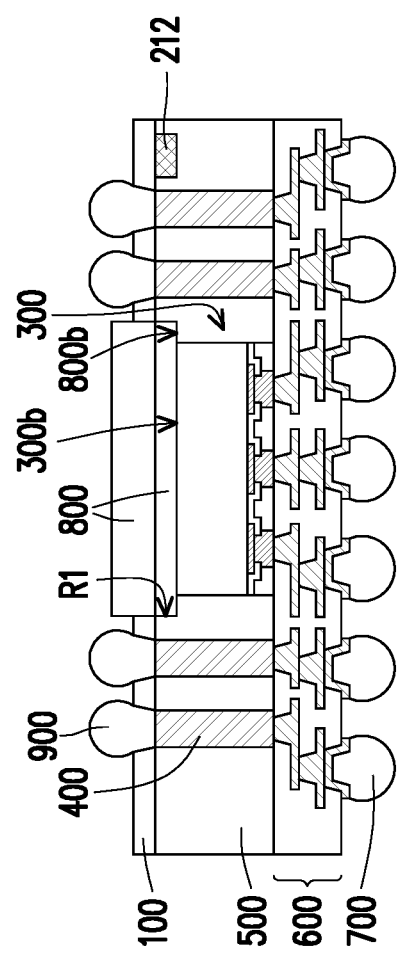

In some embodiments, as shown in FIG. 1N and FIG. 1O, the protective tape TP and the supporting frame SF are removed, and a singulation step is performed to separate individual semiconductor packages 10. In some embodiments, a cleaning step may be optionally performed to remove residuals of the tape TP. In some embodiments, semiconductor packages 10 are separated by cutting through the reconstructed wafer RW along the scribing lanes CC arranged between individual package units PU. In some embodiments, the singulation process typically involves performing a wafer dicing process with a rotating blade and/or a laser beam.

After the singulation step, a plurality of semiconductor packages 10 are obtained. An exemplary cross-sectional view of the semiconductor package 10 according to some embodiments of the disclosure is illustrated in FIG. 1O. Based on the above, the semiconductor package 10 includes the dielectric layer 100, the semiconductor die 300, the TIVs 400, the encapsulant 500, the redistribution structure 600, the connective terminals 700, the heat spreader 800 and the second connective terminals 900. In some embodiments, the semiconductor package 10 may optionally include the cured alignment mark 212. The semiconductor die 300 and the TIVs 400 are electrically connected to the redistribution structure 600. The semiconductor die 300, the TIVs 400 and the cured alignment mark 212 are embedded in the encapsulant 500. In some embodiments, the encapsulant 500 encapsulates at least a portion of the heat spreader 800. In some embodiments, the encapsulant 500 presents a recess R1 exposing the backside surface 300b of the semiconductor die 300. In some embodiments, the span of the recess R1 differs from the span of the backside surface 300b of the semiconductor die 300 and from a span of the encapsulant 500. That is, the encapsulant 500 presents regions of differing thickness within the semiconductor package 10, being thinner where the recess R1 extends beyond the semiconductor die 300. The heat spreader 800 is disposed in the recess R1. In some embodiments, a span of the heat spreader 800 is larger than the span of the semiconductor die 300. In some embodiments, at least a portion of a bottom surface 800b of the heat spreader 800 parallel to the backside surface 300b of the semiconductor die 300 is in contact with the encapsulant 500. In some embodiments, the connective terminals 700 are disposed on the redistribution structure 600 for electrically connecting the semiconductor package 10 with other electronic devices (not shown). In some embodiments, the TIVs 400 and the second connective terminals 900 allow for dual-side electrical connection of the semiconductor package 10.

In some embodiments, using a die attach material that can be patterned as discussed with reference to FIG. 1A through FIG. 1C allows adjustment of the size of the patterned die adhesives 204. In some embodiments, because the size of the patterned die adhesives 204 forming the cured die adhesives 214 (shown in FIG. 1E) was adjusted via a patterning step, the stress produced during removal of the cured die adhesives 214 to form the recess R1 could be efficiently dispersed or attenuated, thus reducing delamination between the encapsulant 500 and the semiconductor die 300. As such, occurrence of defects or failure rate of the produced semiconductor packages 10 may be reduced, thus increasing the overall yield of the manufacturing process and reducing the manufacturing cost per package. In some embodiments, the alignment marks 202 (shown in FIG. 1C) used during a die placement step may be produced during the same patterning step during which the patterned die adhesives 204 (shown in FIG. 1C) are formed, thus simplifying the manufacturing process and further reducing the overall costs.

Figure 1P:
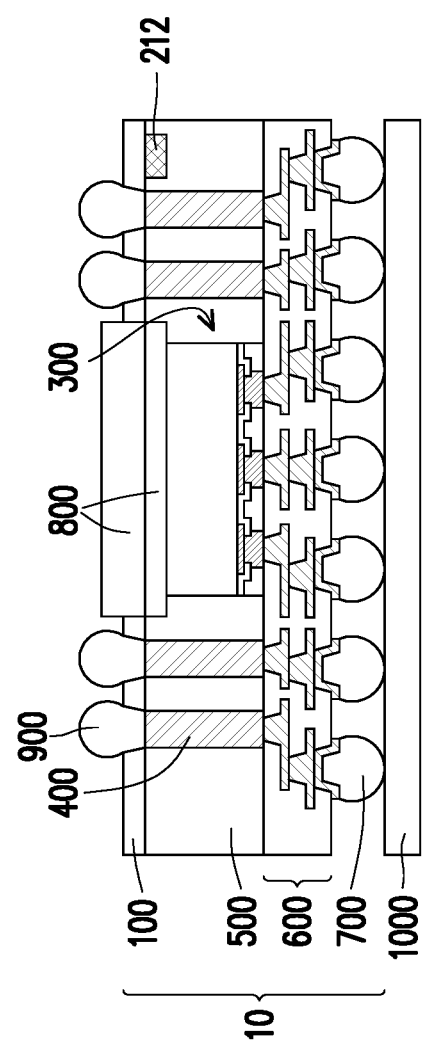

According to some embodiments, the semiconductor package 10 may be connected to a circuit substrate 1000 such as a motherboard, a printed circuit board, or the like, as shown in FIG. 1P.

FIG. 2A through FIG. 2F show schematic bottom views of individual package units PU during the manufacturing process of a semiconductor package according to some embodiments of the present disclosure. In some embodiments, the bottom views of FIG. 2A through FIG. 2F may correspond to bottom views of package units PU formed at the manufacturing stage shown in FIG. 1G, namely after formation of the encapsulant 500. It should be noted that whilst in the schematic views of FIG. 2A through FIG. 2F only the cured die adhesive 214, the cured alignment mark 212 and the encapsulant 500 are shown together with the position of the semiconductor die 300, other elements (such as the TIVs 400) may also be included within the package unit PU, according to the production and design requirements. Furthermore, in some alternative embodiments, the cured alignment mark 212 may not be included within the package unit PU, or not be formed.

Figure 2C:
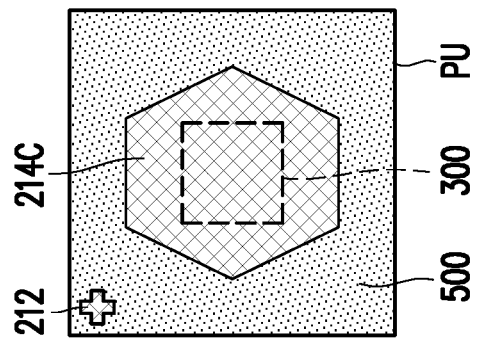
FIG. 2A through FIG. 2F show schematic bottom views of some manufacturing intermediates of semiconductor packages according to some embodiments of the present disclosure.
Figure 2B:
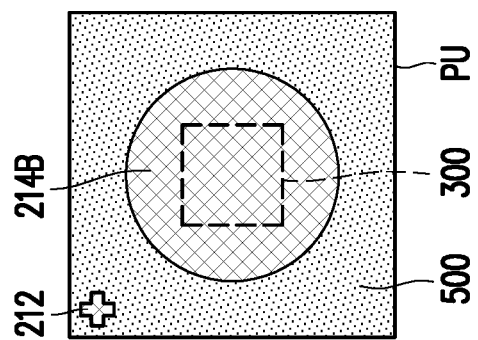
Figure 2A:
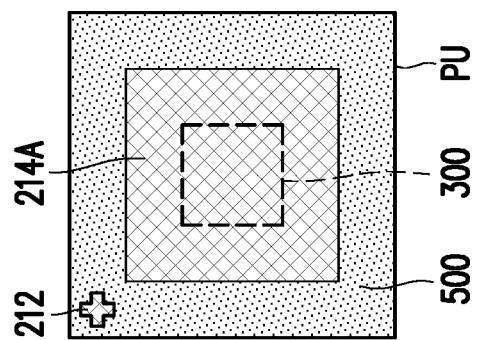

In the manufacturing intermediate shown in FIG. 2A, the semiconductor die 300 and the patterned die adhesive 214A both have a rectangular shape, and the span of the semiconductor die 300 is smaller than a span of the patterned die adhesive 214A. In some embodiments, a vertical projection of the semiconductor die 300 falls entirely within the span of the patterned die adhesive 214A. In FIG. 2A, the cured alignment mark 212 is shown in a corner of the package unit PU, but the disclosure is not limited thereto. The manufacturing intermediates of FIG. 2B and FIG. 2C differ from the manufacturing intermediate of FIG. 2A as the cured die adhesive 214B and 214C have a circular or hexagonal shape, respectively.

Figure 2F:
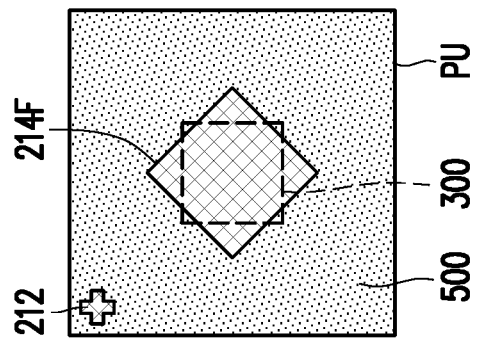
Figure 2E:
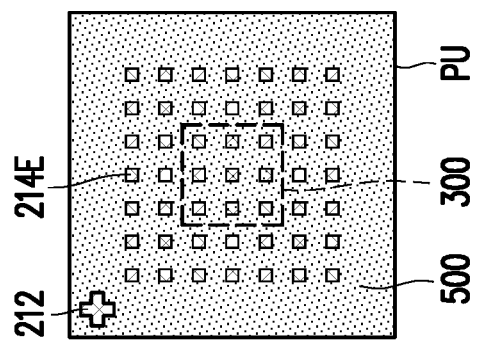
Figure 2D:
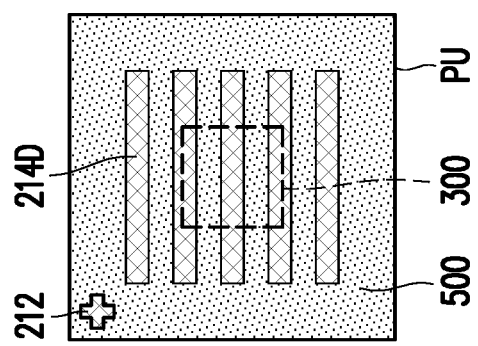

In the manufacturing intermediate shown in FIG. 2D, the cured die adhesive 214D is made of parallel stripes separated by portions of the encapsulant 500. In other words, portions of the encapsulant 500 extend below the semiconductor die 300 in between of the stripes constituting the cured die adhesive 214D. In some embodiments, after the cured die adhesive 214D is stripped and a heat spreader 800 (shown in FIG. 1L) is disposed in contact with the semiconductor die 300 as previously described, portions of the encapsulant 500 extending over the bottom surface 300b of the semiconductor die 300 may be retained in the finished semiconductor package, and be disposed in between parts of the heat spreader 800. For example, the thermal interface material 810 (shown in FIG. 1L) may fill the gaps extending between the portions of the encapsulant 500.

The manufacturing intermediate of FIG. 2E differs from the manufacturing intermediate of FIG. 2D as the cured die adhesive 214E is made of a plurality of tiny portions interspersed within the encapsulant 500. After the thermal interface material 810 (shown in FIG. 1L) is formed, portions of the thermal interface material 810 may interspersed within the encapsulant 500. Whilst in FIG. 2E the tiny portions are shown as squares, the disclosure is not limited thereto, and other shapes may be used according to design and production requirements. It should be noted that, according to some embodiments, in the manufacturing intermediates of FIG. 2D and FIG. 2E a total area of the cured die adhesives 214D and 214E may be smaller than a total area of the bottom surface 300b (shown in FIG. 1D) of the semiconductor die 300, even though portions of the cured die adhesives 214D and 214E may extend beyond than the span covered by the respective semiconductor dies 300.

The manufacturing intermediate of FIG. 2F differs from the manufacturing intermediate of FIG. 2D as the cured die adhesive 214F is in the shape of a rhombus. In some embodiments, corners of the semiconductor die 300 may protrude along the edges of the cured die adhesive 214F, and portions of the encapsulant 500 may extend below said corners.

As can be understood from FIG. 2A through FIG. 2F, the cured die adhesive 214 may be patterned in a wide range of shapes, according to the design and production requirements. Other shapes different than the ones presented here (polygons with fewer or more sides than the ones illustrated, polygons with different inner angles, ovals, simple or composite shapes, etc.) may be realized, and all these shapes are intended to fall within the scope of the present disclosure. In some embodiments, because the recess (for example, the recess R1 shown in FIG. 1K) is formed in the encapsulant 500 by removing the cured die adhesive 214, an outline of the recess will reflect the shape of the cured die adhesive 214.

Figure 3A:
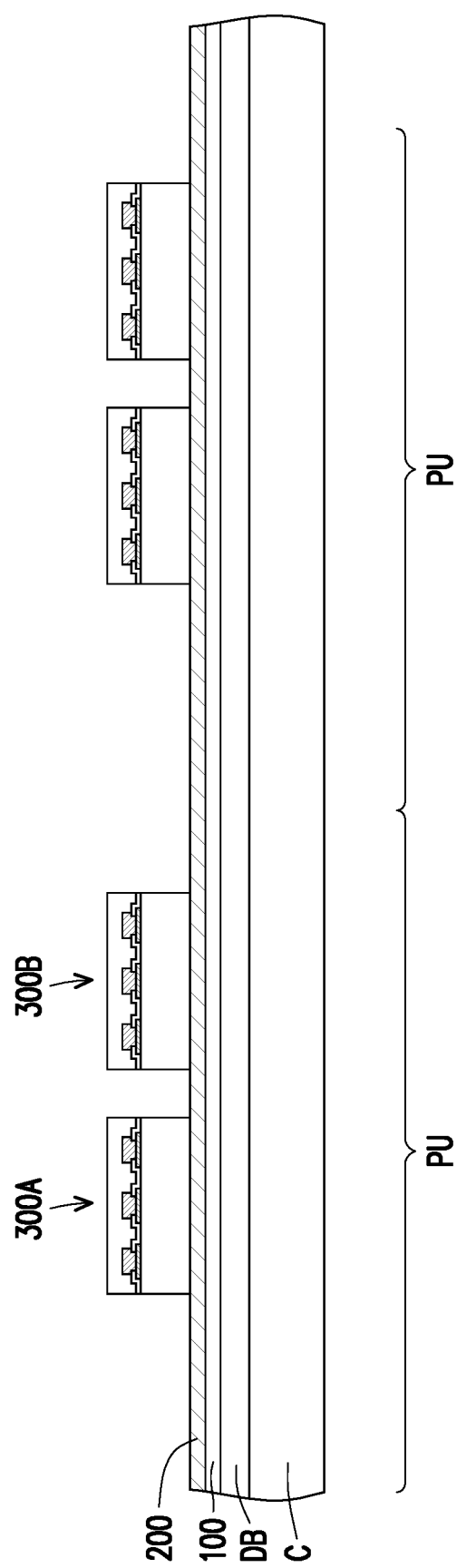
FIG. 3A through FIG. 3C show schematic cross-sectional views of structures produced at various stages of a manufacturing method of a semiconductor package according to some embodiments of the present disclosure.
Figure 3B:
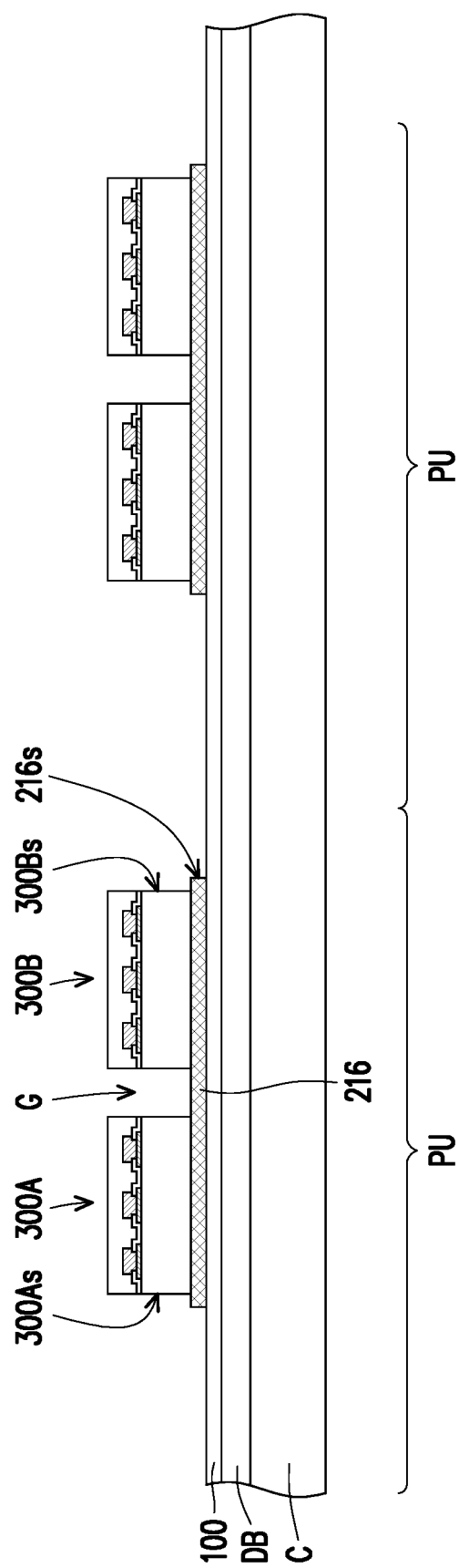
Figure 3C:
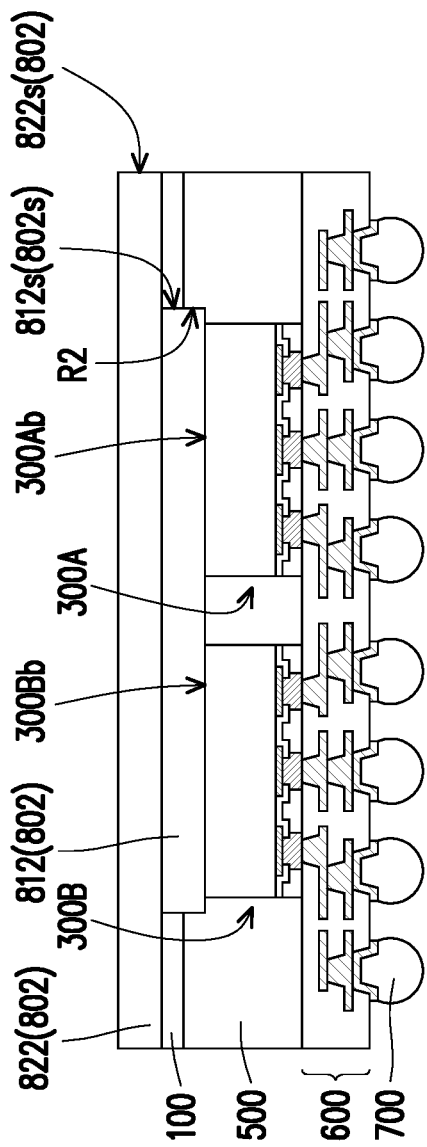

FIG. 3A through FIG. 3B show schematic cross-sectional views illustrating structures produced at various stages of a manufacturing method of a semiconductor package 20 shown in FIG. 3C. The manufacturing intermediate shown in FIG. 3A may be formed from the manufacturing intermediate shown in FIG. 1A by placing semiconductor dies 300A, 300B on the blanket die attach film 200. That is, the semiconductor dies 300A, 300B are placed over the carrier C before the patterning step. Referring to FIG. 3A, according to some embodiments, each package unit PU includes multiple semiconductor dies 300A, 300B. In some embodiments, each of the semiconductor dies 300A, 300B may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor dies 300A, 300B, either one or both, include a memory die such as a high bandwidth memory die. In some embodiments, the semiconductor dies 300A, 300B may be the same type of dies or perform the same functions. In some embodiments, the semiconductor dies 300A, 300B may be different types of dies or perform different functions. The disclosure is not limited by the type of dies used for the semiconductor dies 300A, 300B.

Referring to FIG. 3B, a patterning step and a curing step may be performed to produce a cured die adhesive 216 and to secure the semiconductor dies 300A, 300B over the carrier C. In some embodiments, the patterning step may be run in such a way that the semiconductor dies 300A, 300B share the same portion of cured die adhesive 216. That is, a single portion of cured die adhesive 216 may extend between each of the semiconductor dies 300A, 300B of a package unit PU and the carrier C. In some embodiments, the side edge 216s of the cured die adhesive extends beyond the side surfaces 300As, 300Bs of both semiconductor dies 300A, 300B. As shown in FIG. 3B, in some embodiments, the semiconductor dies 300A, 300B may be disposed beside each other and separated by a gap G. In these cases, the cured die adhesive 216 underneath the semiconductor dies 300A, 300B may extend uninterruptedly at the bottom of the gap G.

Steps similar to the ones previously discussed with reference to FIG. 1E to FIG. 1O may produce the semiconductor package 20 shown in FIG. 3C. As shown in FIG. 3C, according to some embodiments a semiconductor package 20 may include the dielectric layer 100, the semiconductor dies 300A, 300B, the encapsulant 500, the redistribution structure 600, the connective terminals 700, and the heat spreader 802. In some embodiments, the formation of the TIVs 400 (shown in FIG. 1E) and the second connective terminals 900 (shown in FIG. 1M) may be skipped, but the disclosure is not limited thereto. In some alternative embodiments, the semiconductor package 20 may include the TIVs 400 and the connective terminals 900, and be suitable for dual-side vertical integration. The semiconductor dies 300A, 300B may be electrically connected to the redistribution structure 600. The semiconductor dies 300A, 300B are embedded in the encapsulant 500. In some embodiments, the encapsulant 500 presents a recess R2 formed by removal of the cured die adhesive 216 (shown in FIG. 3B). As such, the recess R2 exposes the backside surfaces 300Ab, 300Bb of the semiconductor dies 300A, 300B. In some embodiments, the recess R2 may extend beyond the backside surfaces 300Ab, 300Bb. In some embodiments, the heat spreader 802 may be disposed in the recess R2. In some embodiments, the heat spreader 802 includes the thermal interface layer 812 and the thermal spreader 822. In some embodiments, the thermal interface layer 812 completely fills the recess R2, and the thermal spreader 822 extends over the thermal interface layer 812 and the dielectric layer 100. In some embodiments, an adhesive layer (not shown) may be included between the thermal spreader 822 and the dielectric layer 100 for increased adhesion. In some embodiments, a span of the thermal spreader 822 may match a span of the encapsulant 500, and differs from a span of the thermal interface layer 812. In some embodiments, the span of thermal spreader 822 extends beyond the span of the recess R2. The side surface 802s of the heat spreader 802 includes a first portion 812s defined by the thermal interface layer 812 and a second portion 822s defined by the thermal spreader 822. In the embodiments in which the span of the thermal spreader 822 differs from the span of the thermal interface layer 812, the first portion 812s and the second portion 822s are vertically misaligned. In some embodiments, the heat spreader 802 is shared by the two semiconductor dies 300A, 300B. That is, both semiconductor dies 300A, 300B are in physical contact with the same heat spreader 802. However, the disclosure is not limited thereto. In some alternative embodiments, each semiconductor die 300A, 300B may be in physical contact with a different heat spreader. In some embodiments, a span of the heat spreader 802 is larger than the combined span of the semiconductor dies 300A, 300B. In some embodiments, the connective terminals 700 are disposed on the redistribution structure 600 for electrically connecting the semiconductor package 20 with other electronic devices (not shown).

In some embodiments, the size of the cured die adhesive 216 (shown in FIG. 3B) is adjusted with respect to the span of the semiconductor dies 300A, 300B. In some embodiments, because the size of the cured die adhesive 216 was adjusted via a patterning step, less strain was generated during removal of the cured die adhesive 216 to form the recess R2, thus reducing cracking of the encapsulant 500 or delamination of the encapsulant 500 and the semiconductor dies 300A, 300B. As such, occurrence of defects or failure rate of the produced semiconductor packages 20 may be reduced, increasing the overall yield of the manufacturing process and reducing the manufacturing cost per package.

Figure 4A:
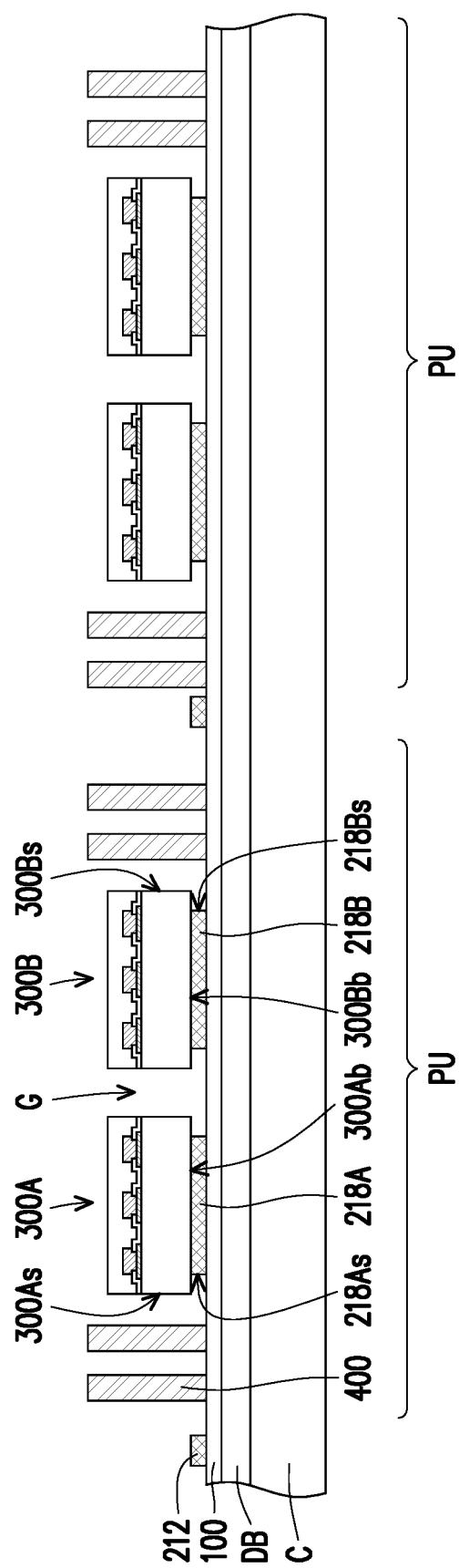
FIG. 4A through FIG. 4B show schematic cross-sectional views of structures produced at various stages of a manufacturing method of a semiconductor package according to some embodiments of the present disclosure.
Figure 4B:
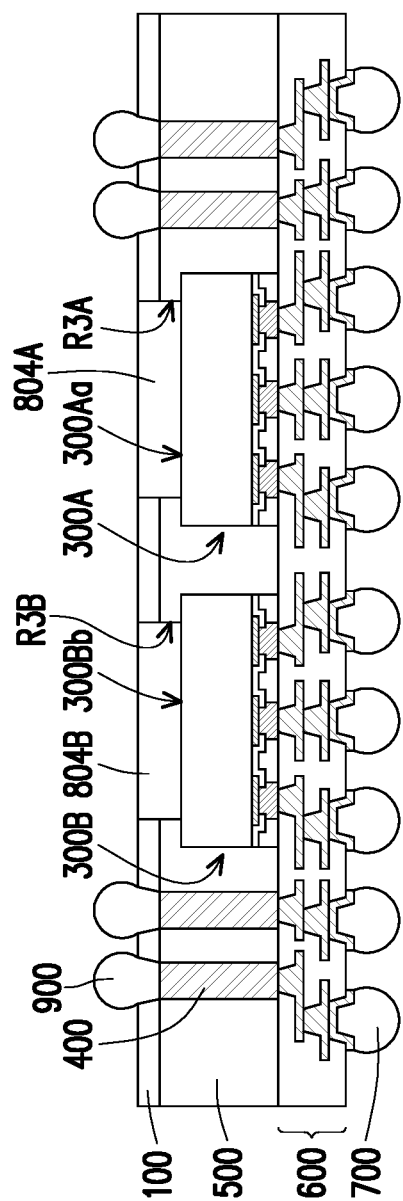

FIG. 4A shows a schematic cross-sectional view illustrating a structure produced at some stage of a manufacturing method of a semiconductor package 30 shown in FIG. 4B. The manufacturing intermediate shown in FIG. 4A may be formed in a similar fashion to what previously described for the manufacturing intermediate shown in FIG. 1E, and a detailed description of the process steps is omitted for the sake of brevity. Referring to FIG. 4A, according to some embodiments, each package unit PU includes a dielectric layer 100, cured die adhesives 218A, 218B, multiple semiconductor dies 300A, 300B, and one or more TIV 400. In some embodiments, cured alignment marks 212 may have been formed during the patterning step in a region adjacent to but outside of the package units PU. As shown in FIG. 4A, in some embodiments, each one of the semiconductor dies 300A and 300B is disposed on a separate portion of cured die adhesive 218A and 218B, respectively. That is, during the patterning step multiple portions of patterned die adhesive (similar to the patterned die adhesive 204 shown in FIG. 1D) are formed within the area of the carrier C corresponding to an individual package unit PU, and only one semiconductor die 300A or 300B is disposed on an individual patterned portion. As shown in FIG. 4A, in some embodiments, when a gap G separates the semiconductor dies 300A, 300B, the dielectric layer 100 may be exposed by the gap G, without any portion of cured die adhesive disposed on top. In some embodiments, a span of each portion of cured die adhesive 218A or 218B may be smaller than a span of the corresponding semiconductor die 300A or 300B. That is, the semiconductor die 300A or 300B may extend beyond the side edge 218As or 218Bs of the underlying portion of cured die adhesive 218A or 218B, respectively. In some embodiments, when TIVs 400 are formed in the package unit PU, the side surface 300As or 300Bs of each semiconductor die 300A or 300B may be closer to the TIVs 400 than the side edge 218As or 218Bs of the underlying portion of cured die adhesive 218A or 218B.

Steps similar to the ones previously discussed with reference to FIG. 1E to FIG. 1O may produce the semiconductor package 30 shown in FIG. 4B. As shown in FIG. 4B, according to some embodiments, the semiconductor package 30 may include the dielectric layer 100, the semiconductor dies 300A, 300B, the TIVs 400, the encapsulant 500, the redistribution structure 600, the connective terminals 700, the heat spreaders 804A and 804B, and the second connective terminals 900. In some embodiments, the cured alignment marks 212 shown in FIG. 4A may have been removed during the singulation step, so that the cured alignment mark 212 are not included in the semiconductor packages 30. In some alternative embodiments (not shown in FIG. 4B), the cured alignment marks 212 may be retained within the finished semiconductor packages. The semiconductor dies 300A, 300B and the TIVs 400 may be electrically connected to the redistribution structure 600. The semiconductor dies 300A, 300B and the TIVs 400 are embedded in the encapsulant 500. In some embodiments, portions of the encapsulant 500 may extend below and physically contact the backside surfaces 300Ab, 300Bb of the semiconductor dies 300A, 300B. In some embodiments, the encapsulant 500 presents one or more recesses R3A, R3B. The first recess R3A may expose a portion of the backside surface 300Ab of the semiconductor die 300A and the second recess R3B may expose a portion of the backside surface 300Bb of the semiconductor die 300B. In some embodiments, because the recesses R3A, R3B have been formed by removing the portions of cured die adhesive 218A, 218B, respectively, the span of one recess R3A or R3B is smaller than a span of the corresponding semiconductor die 300A or 300B. In some embodiments, the first heat spreader 804A may be disposed in the recess R3A, and the second heat spreader 804B may be disposed in the recess R3B. It should be noted that whilst the heat spreaders 804A, 804B are shown as a single block in FIG. 4B, in some embodiments, each may include a thermal interface layer (not shown) and a thermal spreader (not shown), similarly to what discussed for the heat spreader 800 (shown in FIG. 1L). In some embodiments, a span of one heat spreader 804A or 804B may be smaller than the span of the contacting semiconductor dies 300A or 300B. In some embodiments, the connective terminals 700 are disposed on the redistribution structure 600 for electrically connecting the semiconductor package 30 with other electronic devices (not shown). In some embodiments, the TIVs 400 and the second connective terminals 900 allow dual-side electrical connection of the semiconductor package 30.

In some embodiments, the size of the cured die adhesives 218A, 218B (shown in FIG. 4A) is adjusted with respect to the span of the semiconductor dies 300A, 300B. In some embodiments, because the size of the cured die adhesives 218A, 318B (shown in FIG. 4A) was adjusted via a patterning step, the less strain was generated during removal of the cured die adhesives 218A, 218B to form the recesses R3A, R3B thus reducing delamination between the encapsulant 500 and the semiconductor dies 300A, 300B. As such, occurrence of defects or failure rate of the produced semiconductor packages 30 may be reduced, thus increasing the overall yield of the manufacturing process and reducing the manufacturing cost per package.

Figure 5:
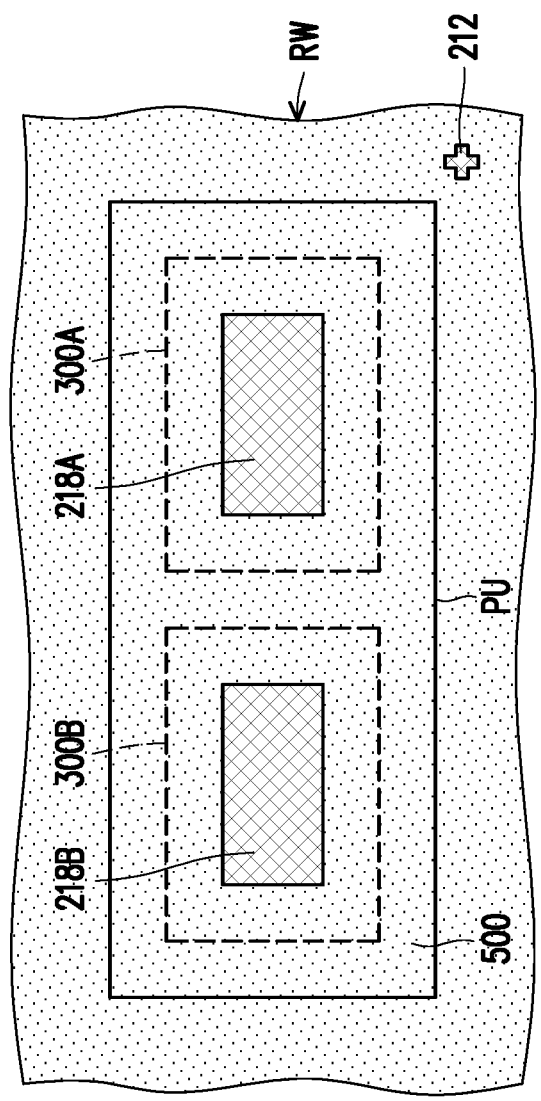
FIG. 5 shows a schematic bottom view of a manufacturing intermediate of a semiconductor package according to some embodiments of the present disclosure.

FIG. 5 shows a schematic bottom view of a portion of a reconstructed wafer RW including a package units PU during the manufacturing process of a semiconductor package according to some embodiments of the present disclosure. In some embodiments, the bottom views of FIG. 5 may correspond to the bottom view of one package unit PU of FIG. 4A after formation of the encapsulant 500. It should be noted that whilst in the schematic views of FIG. 5 only the cured die adhesives 218A, 218F, the cured alignment mark 212 and the encapsulant 500 are shown together with the position of the semiconductor dies 300A, 300B other elements (such as the TIVs 400 shown in FIG. 4A) may also be included within the package unit PU or the reconstructed wafer RW, according to the production and design requirements. As discussed with reference to FIG. 4A, the alignment mark 212 may be formed outside of the area of reconstructed wafer RW constituting an individual package unit PU. However, the disclosure is not limited thereto. In some alternative embodiments, the package unit PU includes the cured alignment mark 212. In some alternative embodiments, the cured alignment mark 212 is not formed.

In the manufacturing intermediate shown in FIG. 5, the semiconductor dies 300A, 300B and the patterned die adhesives 218A, 218B both have a rectangular shape, and the span of each semiconductor die 300A or 300B is larger than the span of the corresponding patterned die adhesive 218A or 218B. Portions of encapsulant 500 extend below each of the semiconductor dies 300A, 300B. In some embodiments, a vertical projection a semiconductor die 300A or 300B encompasses the span of the corresponding patterned die adhesive 218A or 218B. It should be noted that whilst in FIG. 5 the portions of cured die adhesive 218A, 218B are shown to be rectangular, each portion of cured die adhesive 218A or 218B may independently assume any shape according to design or production requirement, as previously discussed with reference to FIG. 2A to FIG. 2F.

In light of the present disclosure, when manufacturing a semiconductor package, the use of a patternable die adhesive allows adjustment of the size of the portions of the die adhesive and the overlying semiconductor dies. In some embodiments, having the side edges of the cured die adhesive protruding or recessed with respect to side surfaces of the overlying semiconductor dies may reduce the strain generated when removing the cured die adhesive. As such, defects such as cracking of the encapsulant or delamination between the encapsulant and the semiconductor dies may be reduced or prevented, resulting in increased yields and lower manufacturing cost of semiconductor packages. Furthermore, if the die adhesive is patterned before placing the semiconductor dies, alignment marks may be formed when patterning the die adhesive. The alignment marks may be used to increase the precision of the die placement step. In some embodiments, as the alignment marks are formed when patterning the die adhesive, a separate step for forming the alignment marks may be avoided, thus simplifying the manufacturing process and further reducing the production costs.

In some embodiments of the present disclosure, a semiconductor package includes a first die and an encapsulant. The first die has an active surface and a backside surface opposite to the active surface. The encapsulant wraps around the first die and has a recess reaching the backside surface of the first die. A span or the recess differs from a span of the backside surface of the first die and differs from a span of the encapsulant.

In some embodiments of the present disclosure, a semiconductor package includes a die, a redistribution structure, a heat spreader, and an encapsulant. The die has an active surface, a backside surface opposite to the active surface, and a side surface connecting the active surface and the backside surface. The redistribution structure is disposed over the active surface and is electrically connected to the die. The heat spreader is disposed on the backside surface of the die. The encapsulant is disposed over the redistribution structure and wraps the die and at least a portion of a side surface of the heat spreader, wherein the side surface of the heat spreader is vertically misaligned with the side surface of the die.

In some embodiments of the present disclosure, a semiconductor package includes a redistribution structure, a semiconductor die, an encapsulant, a dielectric layer, and an alignment mark. The semiconductor die includes a conductive pad disposed at a first surface of the semiconductor die. The semiconductor die is electrically connected to the redistribution structure and is disposed with the first surface facing the redistribution structure. The encapsulant extends on the redistribution structure to laterally wrap the semiconductor die. The encapsulant has a recess formed therein extending up to a second surface of the semiconductor die opposite to the first surface. The dielectric layer extends on the encapsulant opposite with respect to the redistribution structure. The dielectric layer includes an opening revealing the recess. The alignment mark is disposed in contact with the dielectric layer and includes a cured adhesive material. A thickness of the alignment mark equals a depth of the recess.

In some embodiments of the present disclosure, a manufacturing method of a semiconductor package includes at least the following steps. A blanket die attach film is spin-coated. A light exposure process is performed to the blanket die attach film. The blanket die attach film is developed to form a patterned die adhesive. A die is disposed over the patterned die adhesive. The die is disposed with a backside surface closer to the patterned die adhesive. The patterned die adhesive is cured to affix the die. The die and the cured die adhesive are encapsulated in an encapsulant. The cured die adhesive is removed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
   a first die having an active surface and a backside surface opposite to the active surface; and
   an encapsulant, wrapping around the first die and having a recess reaching the backside surface of the first die; and
   an alignment mark disposed in the encapsulant,
   wherein a depth of the recess substantially equals to a thickness of the alignment mark, and a span of the recess differs from a span of the backside surface of the first die and differs from a span of the encapsulant.

2. The semiconductor package of claim 1, further including a heat spreader disposed in the recess and protruding from the encapsulant.

3. The semiconductor package of claim 1, wherein an outline of the recess has a different shape than an outline of the backside surface of the first die.

4. The semiconductor package of claim 1, wherein the span of the recess exceeds the span of the backside surface of the first die.

5. The semiconductor package of claim 1, wherein the span of the backside surface of the first die exceeds the span of the recess.

6. The semiconductor package of claim 1, wherein a second die is disposed beside the first die, and the heat spreader is in physical contact with both of the backside surface of the first die and a backside surface of the second die.

7. The semiconductor package of claim 1, wherein a second die is disposed beside the first die, the encapsulant comprises another recess reaching a backside surface of the second die, and a span of the another recess differs from a span of the backside surface of the second die.

8. A semiconductor package, comprising:
a die, having an active surface, a backside surface opposite to the active surface, and a side surface connecting the active surface and the backside surface;
a redistribution structure, disposed over the active surface and electrically connected to the die;
a heat spreader, disposed on the backside surface of the die;
an encapsulant, disposed over the redistribution structure and wrapping the die and at least a portion of a side surface of the heat spreader, wherein the side surface of the heat spreader is vertically misaligned with the side surface of the die; and
an alignment mark disposed in the encapsulant, wherein a top surface of the alignment mark is exposed by the encapsulant and a bottom surface of the alignment mark is substantially levelled with the back surface of the die.

9. The semiconductor package of claim 8, wherein a portion of a bottom surface of the heat spreader is in physical contact with the encapsulant.

10. The semiconductor package of claim 8, wherein portions of the encapsulant are disposed on the backside surface of the die.

11. The semiconductor package of claim 10, wherein the heat spreader comprises a thermal interface material layer, and portions of the thermal interface material layer are interspersed within the portions of the encapsulant.

12. The semiconductor package of claim 11, wherein portions of the thermal interface material layer are disposed in between the portions of the encapsulant disposed on the backside surface of the die.

13. The semiconductor package of claim 8, wherein a material of the alignment mark comprises an adhesive material.

14. A semiconductor package, comprising:
a redistribution structure;
a semiconductor die, comprising a conductive pad disposed at a first surface of the semiconductor die, wherein the semiconductor die is electrically connected to the redistribution structure and is disposed with the first surface facing the redistribution structure;
an encapsulant extending on the redistribution structure to laterally wrap the semiconductor die, wherein the encapsulant has a recess formed therein extending up to a second surface of the semiconductor die opposite to the first surface;
a dielectric layer, extending on the encapsulant opposite with respect to the redistribution structure, and comprising an opening revealing the recess; and
an alignment mark, disposed in contact with the dielectric layer and comprising a cured adhesive material,
wherein a thickness of the alignment mark equals a depth of the recess.

15. The semiconductor package of claim 14, further comprising a thermal interface material disposed at a bottom of the recess on the second surface of the semiconductor die.

16. The semiconductor package of claim 15, wherein the thermal interface material further extends on a portion of the encapsulant at the bottom of the recess.

17. The semiconductor package of claim 15, further comprising a thermal spreader disposed in contact with the thermal interface material.

18. The semiconductor package of claim 17, wherein the thermal spreader further extends on the dielectric layer, at a side of the dielectric layer opposite with respect to the encapsulant.

19. The semiconductor package of claim 14, further comprising a through interlayer via extending through the encapsulant beside the semiconductor die, from the redistribution structure up to the dielectric layer.

20. The semiconductor package of claim 19, wherein the dielectric layer comprises another opening exposing at its bottom the through interlayer via, and the semiconductor package further comprises a conductive terminal formed in the other opening to contact the through interlayer via.

* * * * *